US012765281B2

(12) United States Patent
Yamada et al.

(10) Patent No.: US 12,765,281 B2
(45) **Date of Patent: *Oct. 13, 2026**

(54) METHOD AND SYSTEM FOR FORMING PATTERNED STRUCTURES USING MULTIPLE PATTERNING PROCESS

(71) Applicant: ASM IP Holding B.V., Almere (NL)

(72) Inventors: Shinya Yamada, Tama (JP); Kai Matsuhisa, Tama (JP); YouJin Choi, Siheung-si (KR); Hyunchul Kim, Hwaseong-si (KR); Eunji Bae, Seongnam-si (KR); SeungRyul Lee, Seoul (KR); Naoki Inoue, Hachioji (JP); Ryu Nakano, Sagamihara (JP); Mao Tsuchiya, Chofu (JP)

(73) Assignee: ASM IP Holding B.V., Almere (NL)

(*) Notice: Subject to any disclaimer, the term of this patent is extended or adjusted under 35 U.S.C. 154(b) by 233 days.

This patent is subject to a terminal disclaimer.

(21) Appl. No.: 18/236,654

(22) Filed: Aug. 22, 2023

(65) Prior Publication Data

US 2023/0395372 A1 Dec. 7, 2023

Related U.S. Application Data

(63) Continuation-in-part of application No. 17/410,983, filed on Aug. 24, 2021, now Pat. No. 12,074,022.
(Continued)

(51) Int. Cl.
*H01L 21/02* (2006.01)
*C23C 16/04* (2006.01)
(Continued)

(52) U.S. Cl.
CPC .......... *H10P 14/6532* (2026.01); *C23C 16/04* (2013.01); *C23C 16/50* (2013.01);
(Continued)

(58) Field of Classification Search
None
See application file for complete search history.

(56) References Cited

U.S. PATENT DOCUMENTS 8,956,984 B2 2/2015 Okuda
9,214,333 B1 12/2015 Sims et al.
(Continued)

FOREIGN PATENT DOCUMENTS

TW 201341569 A 10/2013

*Primary Examiner* — Asok K Sarkar
(74) *Attorney, Agent, or Firm* — Snell & Wilmer L.L.P.

(57) ABSTRACT

Methods of forming patterned structures suitable for a multiple patterning process and manipulating film properties are disclosed. Exemplary methods include forming a layer overlying the substrate, followed by treating the layer, wherein the layer is formed by providing a precursor to the reaction chamber for a precursor pulse period, providing a reactant to the reaction chamber for a reactant pulse period, applying a first plasma power having a first frequency for a first plasma power period, and optionally applying a second plasma power having a second frequency for a second plasma power period, wherein the first frequency is different than the second frequency. Exemplary methods can further include a step of treating the deposited material.

22 Claims, 21 Drawing Sheets

Related U.S. Application Data

(60) Provisional application No. 63/070,950, filed on Aug. 27, 2020.

(51) Int. Cl.

| | |
|---|---|
| ***C23C 16/50*** | (2006.01) |
| ***H01J 37/32*** | (2006.01) |
| ***H01L 21/768*** | (2006.01) |
| ***H10P 14/60*** | (2026.01) |

(52) U.S. Cl.
CPC .... *H01J 37/32165* (2013.01); *H01J 37/3244* (2013.01); *H10P 14/6336* (2026.01); *H10P 14/6339* (2026.01); *H01J 2237/332* (2013.01)

(56) References Cited

U.S. PATENT DOCUMENTS

| | | | |
|---|---|---|---|
| 9,576,792 | B2 | 2/2017 | Chen et al. |
| 10,192,742 | B2 | 1/2019 | Pasquale et al. |
| 10,269,558 | B2 | 4/2019 | Blanquart et al. |
| 10,483,099 | B1 | 11/2019 | Blanquart |
| 11,482,418 | B2 | 10/2022 | Nakano et al. |
| 12,074,022 | B2 * | 8/2024 | Inoue .................... C23C 16/401 |
| 12,417,911 | B2 | 9/2025 | Kengoyama et al. |
| 2006/0269692 | A1 * | 11/2006 | Balseanu ................ C23C 16/56 427/532 |
| 2009/0176380 | A1 * | 7/2009 | Shimazu ........... H01L 21/02211 257/E21.24 |
| 2012/0058282 | A1 | 3/2012 | Hong et al. |
| 2013/0157466 | A1 | 6/2013 | Fox et al. |
| 2014/0051263 | A1 | 2/2014 | Tanaka et al. |
| 2016/0336178 | A1 | 11/2016 | Swaminathan et al. |
| 2018/0005814 | A1 | 1/2018 | Kumar et al. |
| 2018/0108518 | A1 | 4/2018 | Noro et al. |
| 2019/0390331 | A1 * | 12/2019 | Habuka ................... C23C 16/34 |
| 2020/0013629 | A1 | 1/2020 | De Roest et al. |
| 2020/0111669 | A1 | 4/2020 | Zaitsu et al. |
| 2022/0208543 | A1 | 6/2022 | Soe et al. |

* cited by examiner

METHOD AND SYSTEM FOR FORMING PATTERNED STRUCTURES USING MULTIPLE PATTERNING PROCESS

CROSS-REFERENCE TO RELATED APPLICATIONS

This application is a continuation-in-part of U.S. application Ser. No. 17/410,983, filed Aug. 24, 2021, and entitled METHOD AND SYSTEM FOR FORMING PATTERNED STRUCTURES USING MULTIPLE PATTERNING PROCESS, which claims the benefit of and priority to U.S. Application No. 63/070,950 of the same title and filed on Aug. 27, 2020 in the United States Patent and Trademark Office, the disclosures of which are incorporated herein in their entirety by reference.

FIELD OF INVENTION

The present disclosure generally relates to methods and systems for forming patterned structures on a surface of a substrate. More particularly, examples of the disclosure relate to methods and systems that can be used to form patterned structures suitable for use in multiple patterning processes.

BACKGROUND OF THE DISCLOSURE

During the manufacture of electronic devices, fine patterns of features can be formed on a surface of a substrate by patterning the surface of the substrate and removing material from the substrate surface using, for example, wet etch and/or dry etch processes. Photoresist is often used for such patterning of a surface of a substrate.

A photoresist pattern can be formed by coating a layer of photoresist onto a surface of the substrate, masking the surface of the photoresist, exposing the unmasked portions of the photoresist to radiation, such as ultraviolet light or an electron beam, and removing a portion (e.g., the unmasked or masked portion) of the photoresist, while leaving a portion (e.g., the other of the unmasked or masked portion) of the photoresist on the substrate surface. Once the photoresist is patterned, the patterned photoresist can be used as a template for etching material on the substrate surface in regions in which the photoresist was removed to form a transferred pattern in a layer underlying the photoresist. After etching, remaining photoresist can be removed.

As a size of devices decreases, traditional photoresist techniques may not be suitable to form patterns of desired size. In such cases, multiple patterning techniques can be used to allow for patterning and etching of features that can be smaller than the exposure resolution of the photolithography process. A multiple patterning process can include forming a spacer about patterned features (e.g., patterned photoresist), removing the patterned features to form patterned structures, and using the patterned structures as a mask during a subsequent etch.

Although such techniques may work relatively well in some applications, the patterned structures can vary from a vertical position or lean once the patterned features are removed. The leaning of the patterned structures can cause unwanted variation in the subsequent etching step and resulting pattern transfer. This becomes increasingly problematic as the size of the patterned structures decreases.

Accordingly, improved methods of forming patterned structures on a surface of a substrate are desired. Further, device structures, which include the patterned structures, are also desired. And, systems for performing the method are also desired.

Any discussion of problems and solutions set forth in this section has been included in this disclosure solely for the purpose of providing a context for the present disclosure, and should not be taken as an admission that any or all of the discussion was known at the time the invention was made.

SUMMARY OF THE DISCLOSURE

Various embodiments of the present disclosure relate to methods of forming patterned structures on a surface of a substrate and to systems for forming the patterned structures. The patterned structures can be used in the formation of devices, such as semiconductor devices and other electronic devices.

While the ways in which various embodiments of the present disclosure address drawbacks of prior methods and systems are discussed in more detail below, in general, various embodiments of the disclosure provide improved methods of forming patterned structures with desired (e.g., mechanical) properties on a surface of a substrate. The patterned structures can have a relatively high hardness, exhibit relatively low stress, and/or exhibit a relatively low etch rate. Because of their one or more desired properties, patterned structures in accordance with examples of the disclosure can be relatively short, allowing for relatively precise pattern transfer when etching an underlying layer.

In accordance with examples of the disclosure, a method of forming patterned structures using a multiple patterning process is disclosed. The method includes providing a substrate within a reaction chamber and forming a layer overlying the substrate. The substrate includes a surface comprising patterned features. The step of forming the layer can include providing a precursor to the reaction chamber for a precursor pulse period, providing a reactant to the reaction chamber for a reactant pulse period, and applying at least one of a first plasma power, having a first frequency less than 1 MHz for a first plasma power period, and a second plasma power, having a second frequency, for a second plasma power period, wherein the first frequency is different than the second frequency. As set forth in more detail below, the step of providing a reactant to the reaction chamber for a reactant pulse period can be continuous through one or more other steps of the method and/or through one or more deposition cycles. The first frequency can be different (e.g., lower) than the second frequency. In accordance with examples of the disclosure, the first frequency is less than 1 MHz (e.g., between about 300 kHz and about 500 kHz). In accordance with examples of the disclosure, the step of applying the first plasma power and the step of applying the second plasma power overlap. In some cases, the step of applying the first or the second plasma power can be omitted. In accordance with further examples, the step of forming the layer comprises a cyclical deposition process. In accordance with further examples, the reactant pulse period and one or more of the first plasma power period and the second plasma power period overlap. In at least some cases, the precursor pulse period and one or more of the first plasma power period and the second plasma power period do not overlap. In accordance with additional exemplary embodiments of the disclosure, the method includes a step of providing an inert gas during the step of providing a reactant to the reaction chamber for a reactant pulse period. A ratio of inert gas to the reactant is greater than or equal to 2. When the ratio of inert gas to the reactant is greater than or equal to 2, desired mechanical properties (e.g., hardness and low stress) can be maintained. Additionally or alternatively, the inert gas can be provided to the reaction chamber at a flowrate of greater than 3 slm or between greater than 3 slm and about 6 slm. A pressure within the reaction chamber during one or more cycles of the step of forming can be greater than 400 Pa or between greater than 400 Pa and about 500 Pa or about 450±50 Pa. In some cases, the pressure can be between about 100 Pa and about 500 Pa or between about 200 Pa and about 400 Pa.

The method can also include a step of treating the deposited material. The step of treating the deposited material can include providing an oxygen-free gas to the reaction chamber and applying a third plasma power for a third plasma power period to form activated species from the oxygen-free gas to treat the deposited material to thereby form treated material. As discussed in more detail below, use of such a treatment produces patterned structures with desired (e.g., increased) mechanical strength and (e.g., reduced or relaxed) stress, which allows for more precise transfer of a pattern from the patterned structures to an underlying layer. As set forth below, the step of forming the layer and the step of treating the deposited material can be repeated at various ratios to obtain desired properties of the patterned structures. In accordance with examples of these embodiments, an amount of Si—Si bonds in the treated material is greater than an amount of Si—Si bonds in the deposited material. Additionally or alternatively, an amount of carbon in the treated material can be less than an amount of carbon in the deposited material.

The layer, deposited material, or treated material can be or include, for example, a nitride or an oxide, such as a metal oxide, a silicon oxide, a silicon metal oxide, a metal nitride, a silicon nitride, or a metal silicon nitride. As discussed in more detail below, one or more (e.g., mechanical) properties of the layer and/or the patterned features can be manipulated by manipulating one or more of an inert gas:reactant flow ratio to the reaction chamber, manipulating a power of the first plasma power (e.g., LRF) and/or the second plasma power, manipulating an inert gas flowrate, manipulating a pressure within the reaction chamber, manipulating a duration of the first plasma power, and/or manipulating conditions of the treatment step, such as a ratio of deposition steps to treatment steps, plasma power during a treatment step, and plasma power duration during the treatment step.

In accordance with further embodiments of the disclosure, a device structure is provided. The device structure can be formed according to a method as set forth herein. The device structure can include a substrate and one or more patterned structures formed thereon or therein.

In accordance with further examples of the disclosure, a device is formed using a device structure as described herein.

In accordance with yet additional examples of the disclosure, a system configured to perform a method and/or form a device structure as described herein is provided.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIGS. 13-18, 20A, 20B, 21, and 22 illustrate compositions and/or properties of layers formed in accordance with exemplary embodiments of the disclosure.

Figure 19:
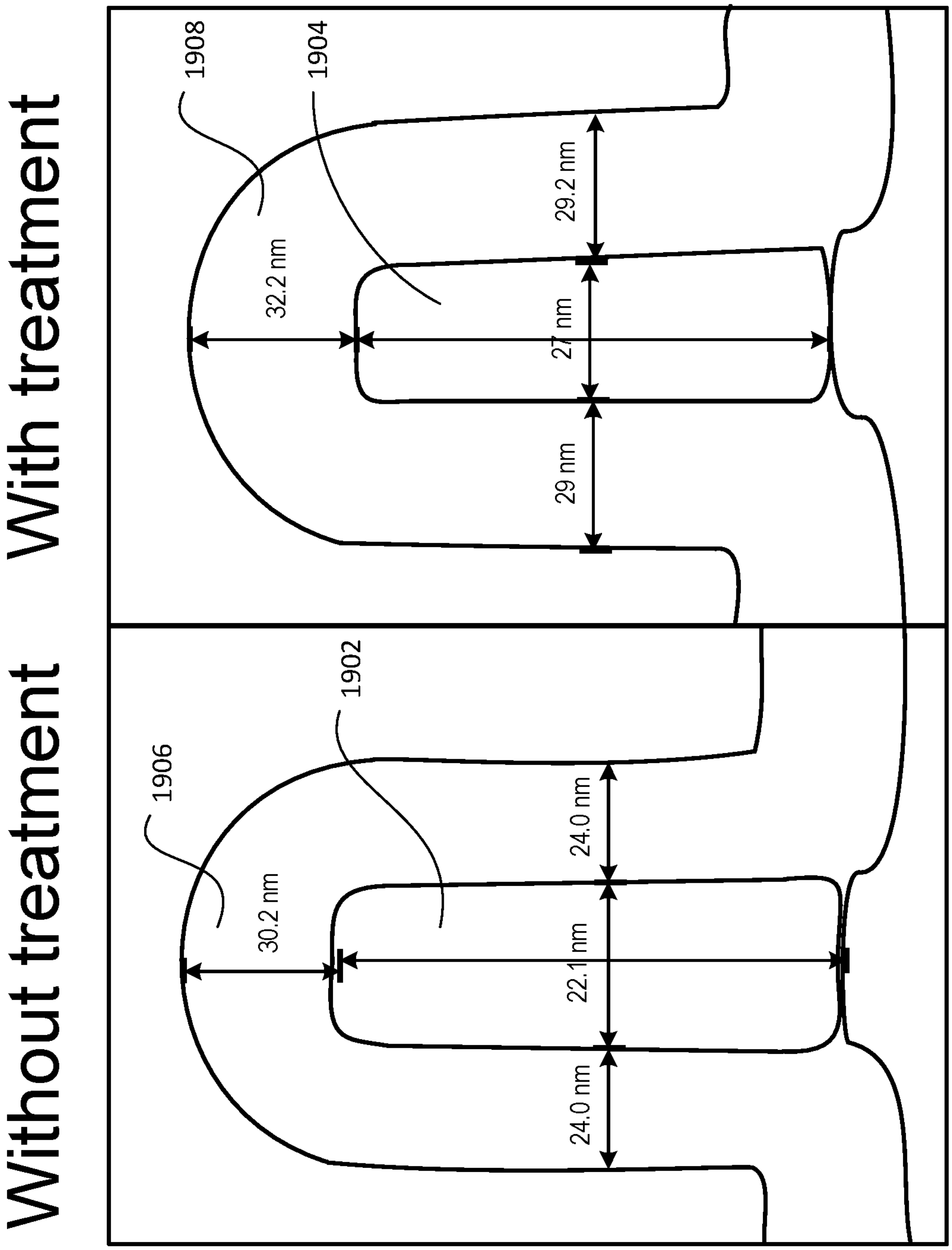

FIG. 19 illustrates a layer deposited according to exemplary embodiments of the disclosure.

Figure 23:
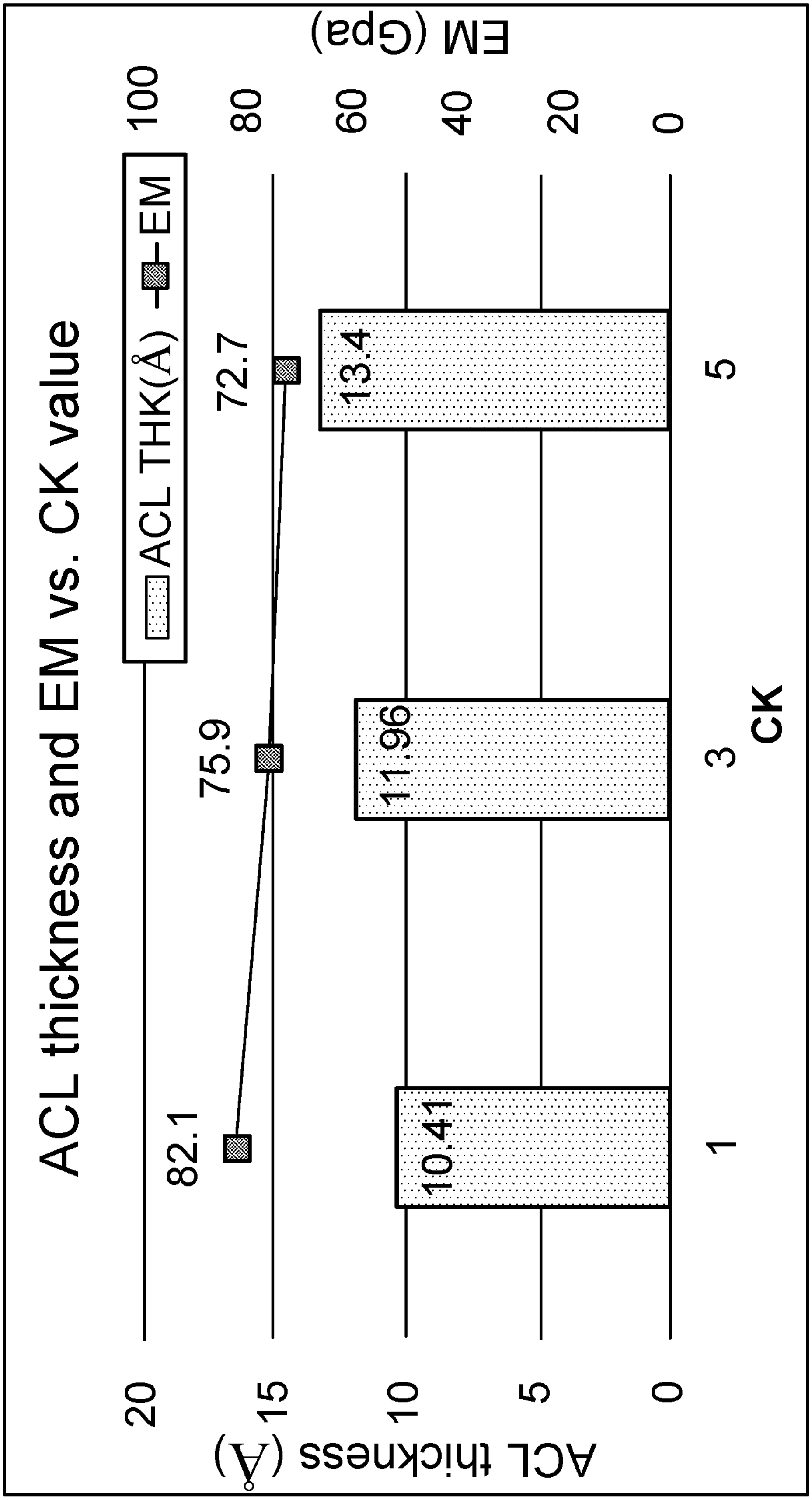
Figure 24:
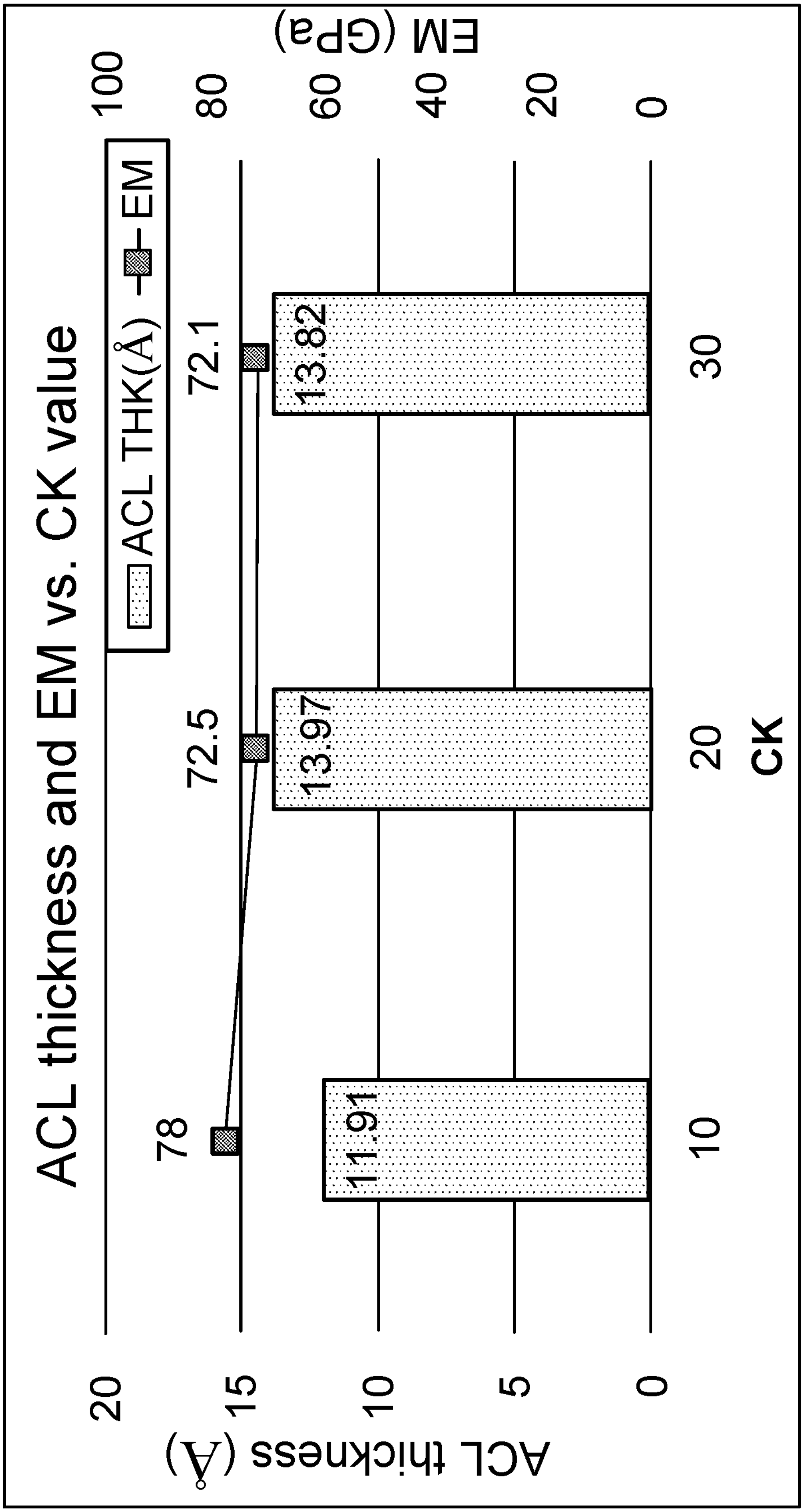

FIGS. 23 and 24 illustrate patterned feature thickness and elastic modulus as a function of CK in accordance with further exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming patterned structures on a surface of a substrate, to device structures including the patterned structures, and to systems for performing the methods and/or forming the device structures. As described in more detail below, exemplary methods can be used to form device structures suitable for forming electronic devices. For example, exemplary methods can be used to form patterned structures on a surface of a substrate. The patterned structures can be used as an etch mask or as patterned features for formation of a next set of patterned structures.

As further set forth in more detail below, exemplary methods and systems can be used to form patterned structures with desired properties, which allow for more precise pattern transfer, more reliable device manufacturing, formation of smaller or higher pitched etch patterns, and more reliable device performance.

In this disclosure, gas may include material that is a gas at normal temperature and pressure, a vaporized solid and/or a vaporized liquid, and may be constituted by a single gas or a mixture of gases, depending on the context. A gas other than the process gas, e.g., a gas introduced without passing through a gas distribution assembly, such as a showerhead, other gas distribution device, or the like, may be used for, e.g., sealing the reaction space, and may include a seal gas, such as a rare or other inert gas. The term inert gas refers to a gas that does not take part in a chemical reaction to an appreciable extent and/or a gas that can excite a precursor when plasma power is applied. In some cases, the terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various features, such as recesses, lines, and the like formed within or on at least a portion of a layer of the substrate. By way of particular examples, a substrate can include bulk semiconductor material and/or a layer to be etched.

In some embodiments, film refers to a layer extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequences, and/or functions or purposes of the adjacent films or layers.

In this disclosure, continuously can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments. For example, a reactant and/or an inert gas can be supplied continuously during two or more steps and/or deposition cycles of a method.

The term cyclic deposition process or cyclical deposition process can refer to the sequential introduction of precursors (and/or reactants) and/or pulsing of plasma power into or within a reaction chamber to deposit a layer over a substrate and includes processing techniques, such as atomic layer deposition (ALD), cyclical chemical vapor deposition (cyclical CVD), hybrid cyclical deposition processes that include an ALD component and a cyclical CVD component, and plasma-enhanced variations thereof.

As used herein, the term atomic layer deposition (ALD) may refer to a vapor deposition process in which deposition cycles, preferably a plurality of consecutive or continuous deposition cycles, are conducted in a process chamber. Typically, during each cycle, a precursor is introduced and may be chemisorbed to a deposition surface (e.g., a substrate surface or a previously deposited underlying surface, such as material from a previous ALD cycle), forming a monolayer or sub-monolayer that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor composition(s), reactive gas, and purge (e.g., inert carrier) gas. PEALD refers to an ALD process, in which a plasma is applied during one or more of the ALD steps.

As used herein, the term purge may refer to a procedure in which an inert or substantially inert gas is provided to a reactor chamber in between two pulses of gases which react with each other. For example, a purge may be provided between a precursor pulse and a reactant pulse, thus avoiding or at least reducing gas phase interactions between the precursor and the reactant. It shall be understood that a purge can be effected either in time or in space, or both. For example, in the case of temporal purges, a purge step can be used, e.g., in the temporal sequence of providing a first precursor to a reactor chamber, providing a purge gas to the reactor chamber, and providing a second precursor to the reactor chamber, wherein the substrate on which a layer is deposited does not move. For example, in the case of spatial purges, a purge step can take the following form: moving a substrate from a first location to which a first precursor is supplied, through a purge gas curtain, to a second location to which a second precursor is supplied.

As used herein, silicon oxide refers to a material that includes silicon and oxygen. Silicon oxide can be represented by the formula $SiO_2$. In some cases, the silicon oxide may not be or include stoichiometric silicon oxide. In some cases, the silicon oxide can include other elements, such as carbon, nitrogen, hydrogen, or the like.

As used herein, silicon nitride refers to a material that includes silicon and nitrogen. Silicon nitride can be represented by the formula $Si_3N_4$. In some cases, the silicon nitride may not be or include stoichiometric silicon nitride. In some cases, the silicon nitride can include other elements, such as carbon, nitrogen, hydrogen, or the like.

As used herein, metal oxide refers to a material that includes at least one metal and oxygen. A metal oxide can be represented by the formula $MO_x$, where M represents a metal (e.g., $TiO_2$). In some cases, the metal oxide may not be or include stoichiometric metal oxide. In some cases, the metal oxide can include other elements, such as carbon, nitrogen, hydrogen, or the like. Exemplary metals include titanium.

As used herein, metal nitride refers to a material that includes at least one metal and nitrogen. A metal nitride can be represented by the formula $MN_x$ (e.g., TiN), where M can be one or more metals. In some cases, the metal nitride may not be or include stoichiometric metal nitride. In some cases, the metal nitride can include other elements, such as carbon, nitrogen, hydrogen, or the like. Exemplary metals include titanium.

A silicon metal oxide can be a metal oxide that can additionally include silicon. A silicon metal oxide can be represented by the formula $Si_xM_{(1-x)}O_y$, wherein M represents at least one metal element, x is less than one including zero, and y is approximately two or a stoichiometrically-determined number, wherein M is a metal, such as titanium.

A silicon metal nitride can be a metal nitride that can additionally include silicon. A silicon metal nitride can be represented by the formula $Si_xM_{(1-x)}N_y$, wherein M represents at least one metal element, x is less than one including zero, and y is a suitable or a stoichiometrically-determined number. M can be or include, for example titanium.

As used herein, the term overlap can mean coinciding with respect to time and within a reaction chamber. For example, when two or more plasma power periods overlap, there is a period of time in which power for each of the two or more plasma power periods is provided to a reaction chamber. Similarly, with regard to gas pulse periods, such as precursor pulse periods and reactant pulse periods, two or more gas pulse periods can overlap when gas from the respective pulse periods are within the reaction chamber or provided to the reaction chamber fora period of time.

Further, in this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, or the like in some embodiments. Further, in this disclosure, the terms include, including, constituted by and having can refer independently to typically or broadly comprising, consisting essentially of, or consisting of in some embodiments. In this disclosure, any defined meanings do not necessarily exclude ordinary and customary meanings in some embodiments.

Figure 1:
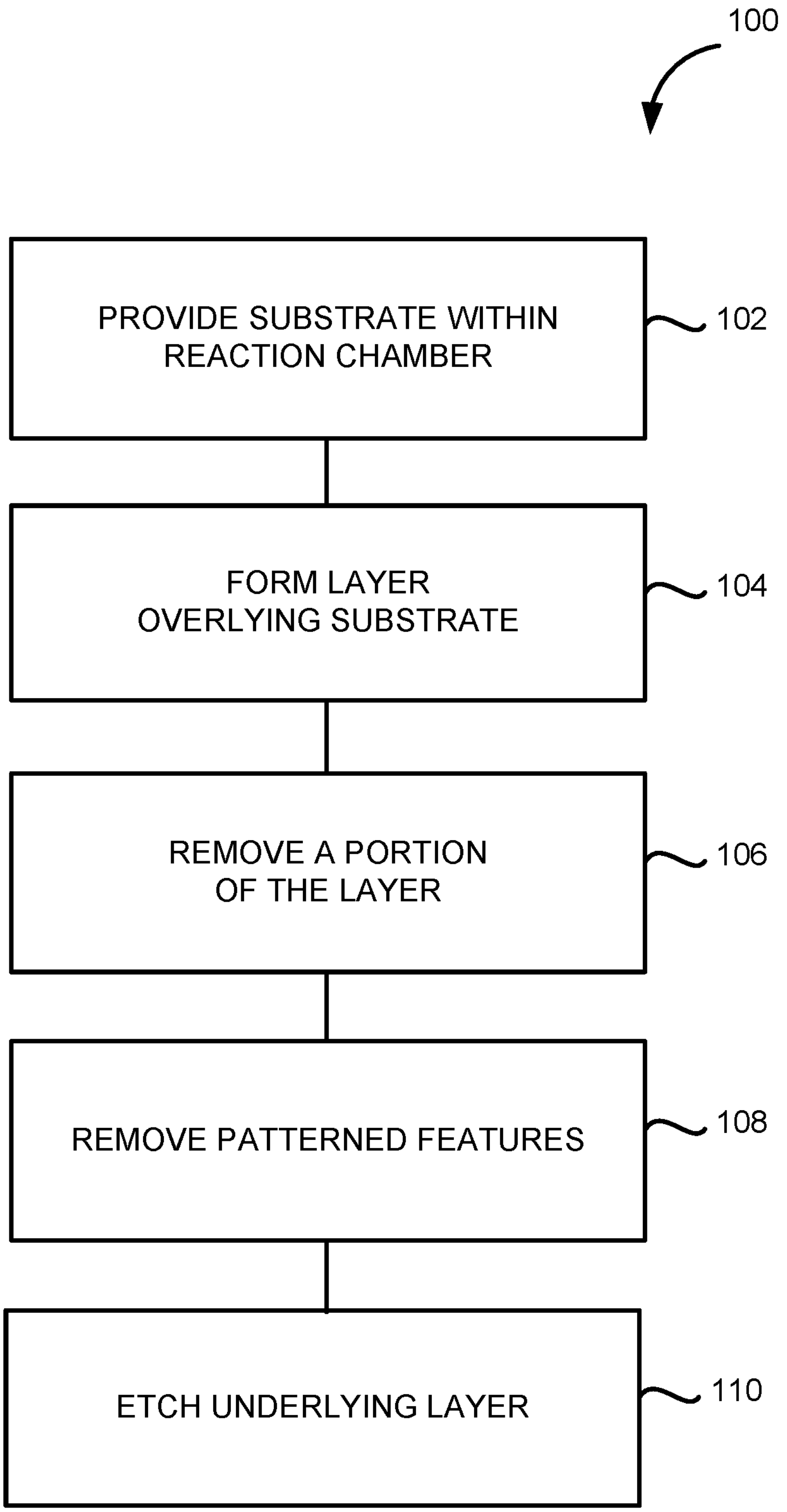
FIG. 1 illustrates a method in accordance with at least one embodiment of the disclosure.

Turning now to the figures, FIG. 1 illustrates a method 100 of forming patterned structures (e.g., using a multiple patterning process) in accordance with examples of the disclosure. Method 100 includes the steps of providing a substrate within a reaction chamber (step 102), forming a layer overlying the substrate (step 104), removing a portion of the layer (step 106), removing the patterned features, (step 108), and etching the underlayer (step 110). As discussed in more detail below, exemplary methods can also include a step of treating deposited material (e.g., material deposited during step 104). Although illustrated with steps 102-110, exemplary methods need not include all such steps, but rather can include any subset of the steps.

Figure 3:
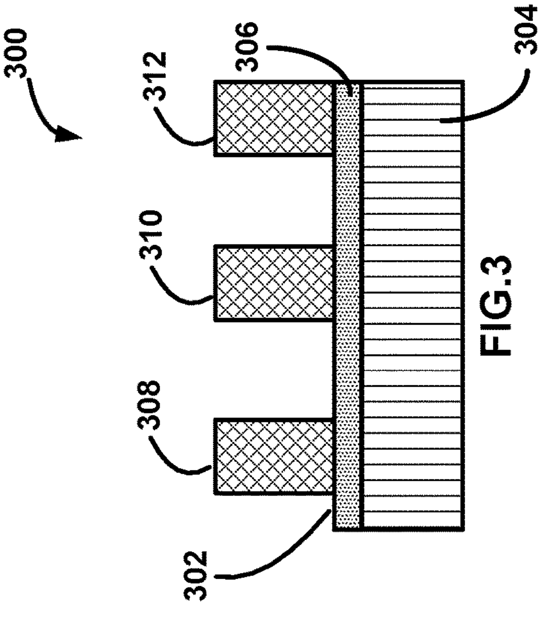
FIGS. 3-7 illustrate structures in accordance with exemplary embodiments of the disclosure.

During step 102, a substrate comprising a surface comprising patterned features is provided within a reaction chamber of a reactor system. An exemplary substrate 300 for use during step 102 is illustrated in FIG. 3. In this example, the substrate (a device structure) includes a first layer or bulk material 304, a second layer 306 (e.g., a layer to be etched), and a surface 302, including patterned features 308-312. First layer or bulk material 304 can include, for example, silicon or other semiconductor material; second layer 306 can include, for example, one more materials having etching selectivity against materials used to form features 308-312 and layer 402, and patterned features 308-312 can include, for example, one or more of photoresist, carbon hardmask material, amorphous silicon, amorphous carbon, or polysilicon.

Returning again to FIG. 1, the reaction chamber used during step 102 can be or include a reaction chamber of a chemical vapor deposition reactor system configured to perform a cyclical deposition process. The reaction chamber can be a standalone reaction chamber or part of a cluster tool.

Step 102 can include heating the substrate to a desired deposition temperature within the reaction chamber. In some embodiments of the disclosure, step 102 includes heating the substrate to a temperature of less than 800° C. For example, in some embodiments of the disclosure, heating the substrate to a deposition temperature may comprise heating the substrate to a temperature between approximately 50° C. and approximately 300° C. or is between about 20° C. and about 100° C. or between about 40° C. and about 80° C. In addition to controlling the temperature of the substrate, a pressure within the reaction chamber may also be regulated. For example, in some embodiments of the disclosure, the pressure within the reaction chamber during step 102 may be less than 760 Torr or between 0.2 Torr and 760 Torr or about 1.5 Torr and 10 Torr. In some cases, a pressure within the reaction chamber is greater than 400 Pa or between greater than 400 Pa and about 500 Pa or about 450±50 Pa or is between about 100 Pa and about 500 Pa or between about 200 Pa and about 400 Pa during step 102 and/or step 104.

During step 104, a layer (e.g., layer 402, illustrated in FIG. 4) is formed overlying the substrate provided in step 102. Layer 402 can be or include, for example, a nitride or an oxide, such as a metal oxide, a silicon oxide, a silicon metal oxide, a metal nitride, a silicon nitride, or a silicon metal nitride. Layer 402 can be relatively thin, e.g., less than about 20 nm, because of the desirable properties of layer 402. In particular, as discussed in more detail below in connection with FIGS. 9 and 10, layer 402 can have relatively low stress and relatively high hardness, which allows formation of patterned structures or layer 402 with a lower thickness. Further, layer 402 can exhibit a high etch selectivity, compared to typical films used to form patterned structures.

Step 104 can include depositing a material and, in at least some cases, treating the deposited material. In accordance with examples of the disclosure, the step of depositing the material includes providing a precursor to the reaction chamber for a precursor pulse period, providing a reactant to the reaction chamber for a reactant pulse period and applying at least one of a first plasma power, having a first frequency less than 1 MHz for a first plasma power period, and a second plasma power, having a second frequency, for a second plasma power period, wherein the first frequency is different than the second frequency. The pressure and/or temperature during step 104 can be the same or similar to the temperature set forth in connection with step 102.

As used herein, pulse period means a period in which a gas (e.g., precursor, reactant, inert gas, and/or carrier gas) is flowed to a reaction chamber and/or a period in which power is applied (e.g., power to produce a plasma). A height and/or width of the illustrated pulse period is not necessarily indicative of a particular amount or duration of a pulse.

Figure 2:
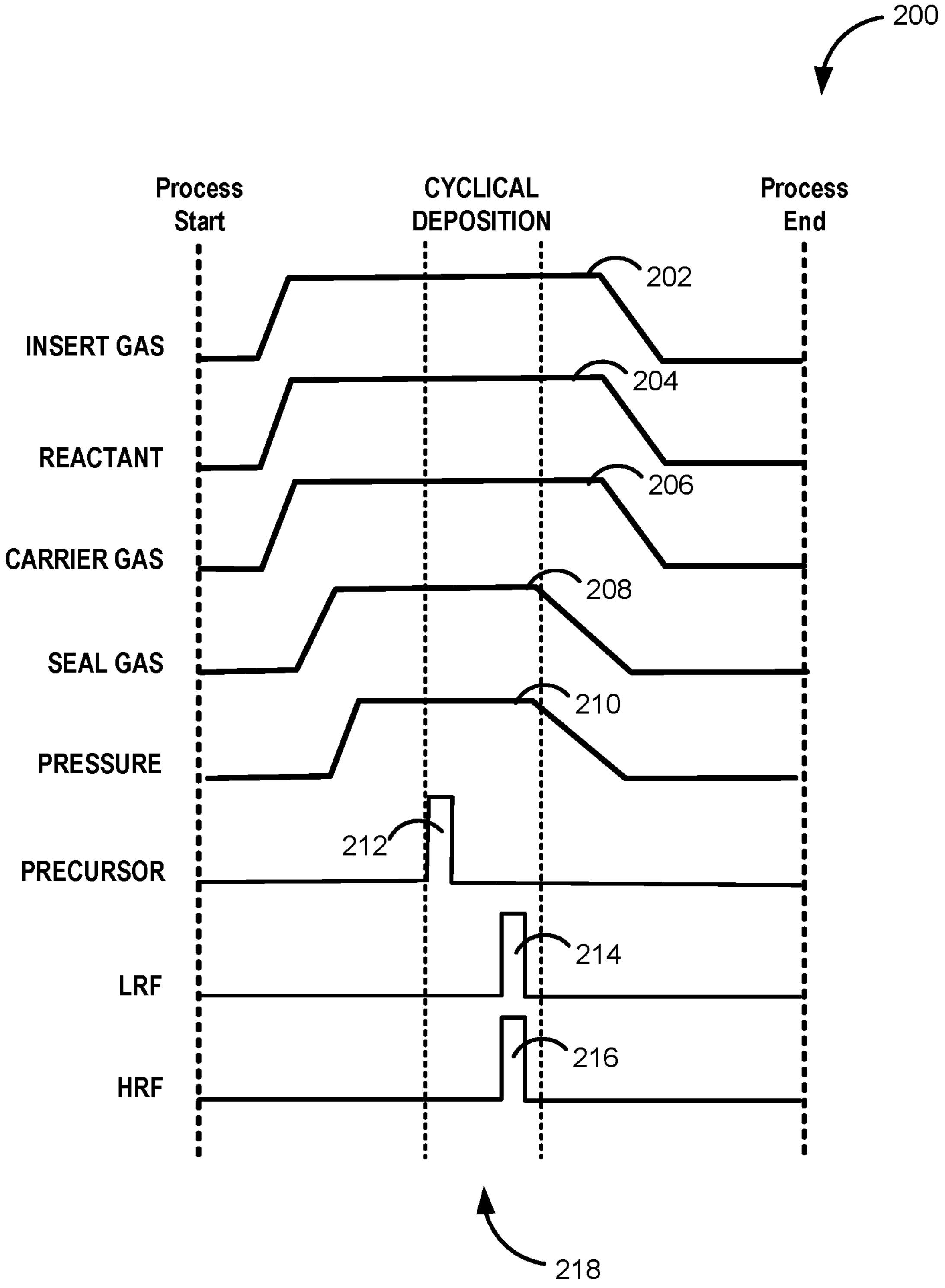
FIG. 2 illustrates a timing sequence in accordance with at least one embodiment of the disclosure.

FIG. 2 illustrates an exemplary timing sequence 200 suitable for step 104 of forming a layer overlying the substrate. In the illustrated example, a precursor is provided to the reaction chamber for a precursor pulse period 212, a reactant is provided to the reaction chamber for a reactant pulse period 204, a first plasma power (e.g., having a frequency of less than 1 MHz) is applied to form a plasma during a first plasma power period 214 and optionally a second plasma power having a second frequency is applied for a second plasma power period. The second frequency can be higher (e.g., between about 13 MHz and about 14 MHz or about 26 MHz and about 28 MHz) compared to the first frequency (less than 1 MHz or, e.g., between about 300 kHz and about 500 kHz). As illustrated, sequence 200 can include one or more deposition cycles 218; each deposition cycle can include a precursor pulse period 212, a first plasma power period 214 and optionally a second plasma power period 216. In the illustrated case, deposition cycle 218 comprises a cyclical deposition process. The temperatures and/or pressures noted above can desirably be stabilized prior to one or more deposition cycles 218.

During precursor pulse period 212, a precursor is provided to the reaction chamber. In the illustrated example, a precursor is provided after a reactant is provided to the reaction chamber and before power to form a plasma is provided. Further, as illustrated, precursor pulse period 212 ceases prior to first plasma power period 214 and second plasma power period 216.

Exemplary precursors suitable for use with precursor pulse period 212 comprise one or more of silicon and a metal. For example, the precursors can include a metal precursor, a silicon precursor, or both. Exemplary silicon precursors can be selected from the group consisting of aminosilane, halogenated silane, monosilane, and disilane as a precursor. The aminosilane and halogenated silane include, but are not limited to, $Si_2Cl_6$, $SiCl_2H_2$, $SiI_2H_2$, bisdiethylaminosilane, bisdimethylaminosilane, hexaethylaminodisilane, tetraethylaminosilane, tert-butylaminosilane, bistert-butylaminosilane, trimethylsilyldiethylamine, trimethylsilyldiethylamine, and bisdimethylaminodimethylsilane. Exemplary metal precursors can include one or more of Ti, W, Ta, Mn, Hf, and/or Ru. For example, a precursor for titanium oxide can be at least one compound selected from titanium alkoxide and alkylamino titanium, including $Ti(OR)_4$ wherein R is independently $C_xH_y$ (x=0, 1, 2, 3, 4, or 5, y=2x+1), and each R can be different (e.g., $Ti(OCH_3)_2(OC_2H_5)(OC_3H_2)$); $Ti(NR_2)_4$ wherein R is independently $C_xH_y$ (x=0, 1, 2, 3, 4, or 5, y=2x+1), and each R can be different (e.g., $Ti(N(CH_3)(C_2H_5))_4$). A precursor for a metal oxide other than titanium oxide can also be selected from any suitable compounds. In general, an alkylamino precursor, such as tetrakis-dimethylaminotitanium (TDMAT), can provide a higher film growth rate than does an alkoxy precursor, such as titanium tetraisopropoxide (TTIP), because a precursor having a smaller molecular size, such as TDMAT, tends to have less steric hindrance, so as to have more adsorption sites as compared with a precursor having a greater molecular size, such as TTIP. A precursor with a carrier gas flowrate may be in a range of about 500 to about 5000 sccm. A duration of precursor pulse period 212 can range from about 0.05 to about 5 seconds. During reactant pulse period 204, a reactant is provided to the reaction chamber. In the illustrated example, a reactant is provided continuously during (e.g., before, during, and after) one or more deposition cycles 218.

Exemplary reactants suitable for use with reactant pulse period 204 include one or more of oxygen, hydrogen and nitrogen, alone or in any combination with an inert gas. In some cases, the reactant can include a mixture of $N_2$+$H_2$, $H_2$ or $NH_3$, $O_2$, $N_2O$, $CO_2$, or the like. A reactant gas flowrate may be in a range of about 100 to about 10000 sccm.

During first plasma power period 214, a power suitable to produce a plasma is provided. The plasma may be a direct plasma—formed within the reaction chamber. In accordance with examples of the disclosure, power provided during first plasma power period 214 has a relatively low frequency—e.g., less than 1 MHz or between about 300 kHz and about 500 kHz. The power applied during first plasma power period 214 can be less than 500 W (e.g., for a 300 mm substrate) or similar power density or between about 50 W and about 500 W for a 300 mm substrate or similar power density. In the figures and description, LRF corresponds to low-frequency power and HRF corresponds to high-frequency power.

Although patterned structures can be formed using only higher frequency power (e.g., 13.56 MHz), higher power (e.g., 500 W) and longer plasma times are generally required to form layer 402. The patterned features can be damaged—e.g., due to the consumption of the patterned features by the use of only high-frequency power at the higher power and/or longer times. The damaged features can, in turn, result in undesired variation in subsequent etch processes.

During second plasma power period 216, a second power suitable to produce a plasma is optionally provided. The frequency of the power provided during the second plasma power period 216 is higher than the frequency of the power provided during the first plasma power period 214. For example, the frequency can be between about 13 MHz and about 14 MHz or about 26 MHz and about 28 MHz. The power (W) applied during period 216 can be the same or similar to the power provided during period 214.

In some cases, the power supplied during first plasma power period 214 and/or second plasma power period 216 can be continuous or pulsed. A duration of one or more of the first plasma power period and the second plasma power period can be greater than 0 and less than 0.5 seconds and/or a duration per cycle can be greater than 0 to about 0.5 seconds per pulse.

As illustrated in FIG. 2, in some cases, the step of applying the first plasma power (first plasma power period) and the step of applying the second plasma power (second plasma power period) overlap. In some cases, a method may not include the step of applying the second plasma power.

Figure 10:
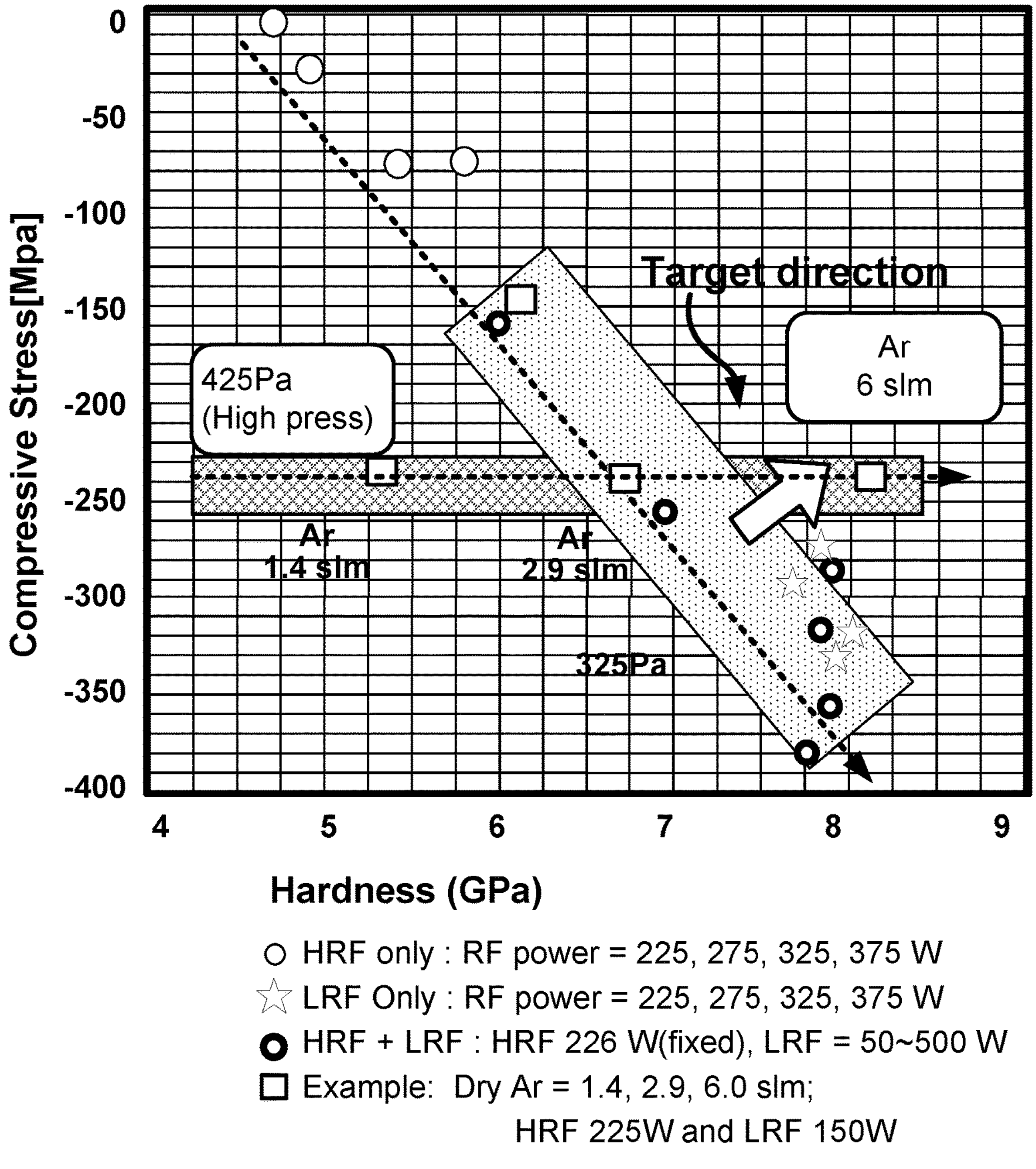
FIG. 10 illustrates hardness and stress values of layers formed in accordance with additional examples of the disclosure.

Timing sequence 200 can also include an inert gas pulse period 202, a carrier gas pulse period 206, a seal gas pulse period 208, and a pressure pulse period 210. Inert gas pulse period 202 can include providing an inert gas (e.g., with or overlapping with a reactant provided during reactant pulse period 204). Exemplary inert gases include one or more of argon, helium and/or nitrogen. A duration of inert gas pulse period 202 can be the same or similar to the duration of reactant pulse period 204. A flowrate of the inert gas can be between about 0 and about 10000 sccm. By way of particular examples, the inert gas can be or include argon; a flowrate of the inert gas during step 202 can be greater than 3 slm or between greater than 3 slm and about 6 slm. As illustrated in FIG. 10, when the inert gas (e.g., Ar) flowrate is greater than 3 slm, a film stress is lower than the existing conditions, whilst the film hardness is almost the same as the existing ones. For example, when the process pressure is 425 Pa, Ar flowrate is 6 slm, HRF is 225 W and LRF is 150 W, 8.09 GPa of film hardness and a −235 MPa of film stress are achieved.

During carrier gas pulse period 206, a carrier gas (e.g., used to facilitate providing a precursor), such as one or more of argon, helium, alone or in any combination, is provided to the reaction chamber. A flowrate of the carrier gas can be between about 500 and about 5000 sccm.

During seal gas pulse period 208, a seal gas can be introduced into an interior of the reactor to facilitate separation of a reaction zone and a transfer zone within the interior of the reactor. As illustrated, a seal gas pulse period 208 can begin before a deposition cycle and end after the last deposition cycle.

Table 1 illustrates exemplary process conditions in accordance with particular examples of the disclosure. The table is meant to illustrate exemplary conditions and not necessarily limit the scope of the disclosure.

TABLE 1

| | | Exemplary Conditions |
|---|---|---|
| Dry inert gas (e.g., Ar) | [slm] | 3.0 to 10.0 (preferably 5.0 to 8.0) |
| Carrier gas (e.g., Ar) | [sccm] | 2.0 to 8.0 (preferably 4.0 to 6.0) |
| Reactant (e.g., $O_2$) | [sccm] | 2.0 to 8.0 (preferably 4.0 to 6.0) |
| Seal gas (e.g., He) | [sccm] | 0.1 to 0.6 (preferably 0.2 to 0.4) |
| Reaction chamber pressure | [Pa] | 400 to 500 (preferably 420 to 480) |
| HRF | [W] | 200 to 250 (preferably 220 to 230) |
| LRF | [W] | 120 to 180 (preferably 140 to 160) |
| Precursor source vessel temperature | [deg C.] | 40 to 70 (preferably 50 to 60) |
| Susceptor temperature | [deg C.] | 60 to 100 (preferably 70 to 90) |
| Gas distribution system (e.g., showerhead) temperatures | [deg C.] | 60 to 100 (preferably 70 to 90) |
| Reaction chamber wall temperature | [deg C.] | 50 to 80 (preferably 60 to 70) |
| Precursor pulse time | [sec] | 0.05 to 0.40 (preferably 0.10 to 0.20) |
| Precursor purge time | [sec] | 0.05 to 0.40 (preferably 0.10 to 0.30) |
| RF ON | [sec] | 0.05 to 0.40 (preferably 0.10 to 0.20) |
| Post-plasma purge | [sec] | 0.01 to 0.10 (preferably 0.05 to 0.06) |

Figure 12:
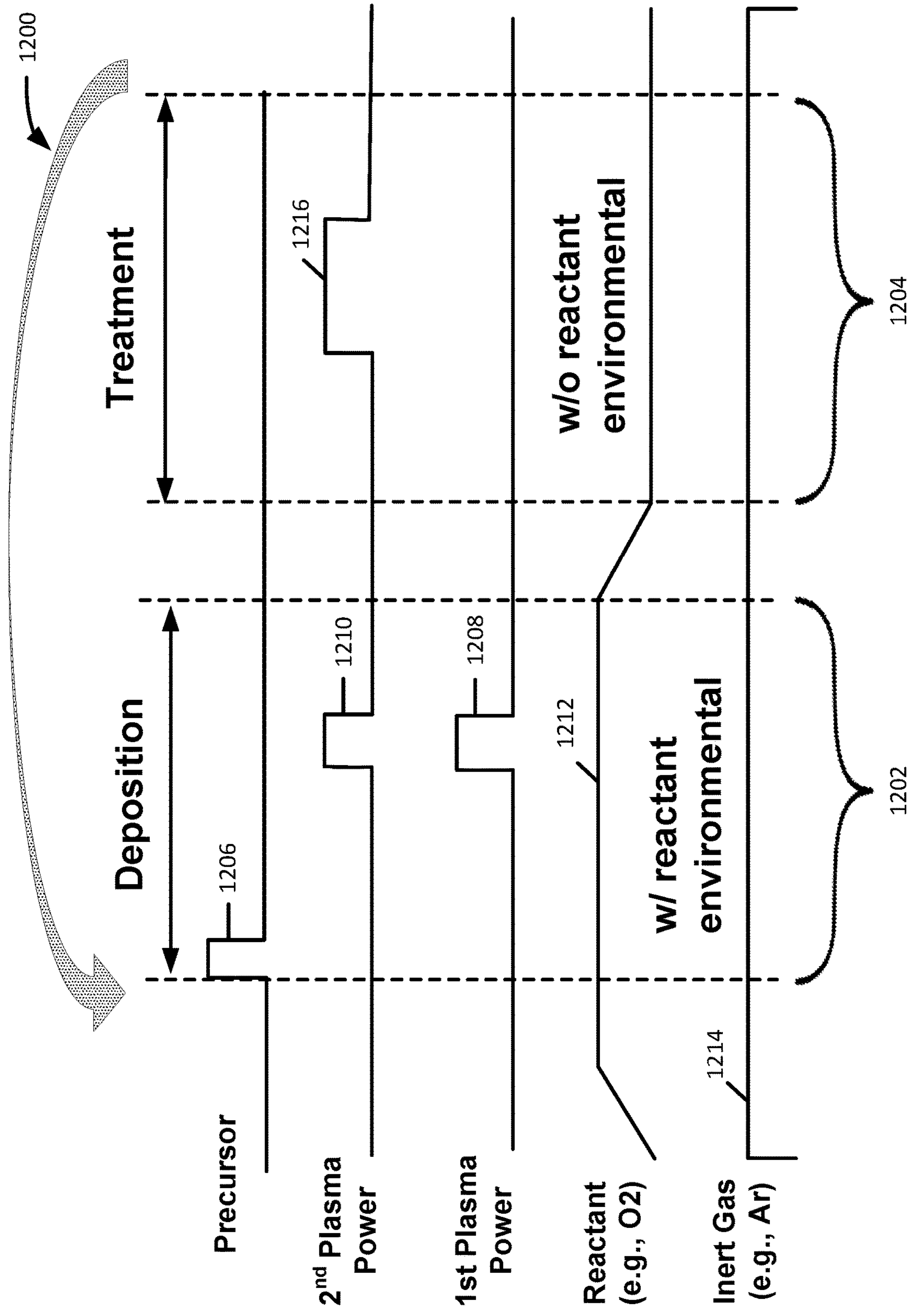
FIG. 12 illustrates another timing sequence suitable for forming a layer in accordance with additional embodiments of the disclosure.

FIG. 12 illustrates another timing sequence 1200 suitable for step 104 of forming a layer overlying the substrate. In this case, timing sequence 1200 includes a deposition cycle 1202 and a treatment cycle 1204.

Deposition cycle 1202 can be the same or similar to deposition cycle 218 described above. In particular, deposition cycle 1202 can include a precursor pulse period 1206, a first plasma power period 1208 and/or a second plasma power period 1210, a reactant pulse period 1212, and an inert gas pulse or continuous supply 1214. Deposition cycle 1202 comprises a cyclical deposition process. The temperatures and/or pressures noted above can be as noted above in connection with steps 102 and 104 and can desirably be stabilized prior to one or more deposition cycles 1202.

The precursor, reactant, inert gas, precursor pulse period 1206, reactant pulse period 1212, inert gas pulse period 1214, first and second plasma power pulse periods 1208 and 1210, first and second plasma power frequencies, and reactor conditions can be as described in connection with FIG. 2. By way of examples, a power applied during first plasma power period 1208 can have a first frequency between about 300 kHz and about 500 kHz and/or a first plasma power between about 50 W and about 300 W or between about 100 W and about 200 W. Additionally or alternatively, a power applied during second plasma power period 1210 can have a second frequency between about 13 MHz and about 14 MHz or between about 26 MHz and about 28 MHz and/or a second plasma power between about 100 W and about 400 W or between about 200 W and about 300 W. The first frequency can be a low radio frequency (LRF) and the second frequency can be a high radio frequency (HRF).

The step of depositing material can be repeated one or more times prior to the step of treating the deposited material (cycle 1204). Further, as illustrated, deposition cycle(s) 1202 and treatment cycle(s) 1204 can be repeated a number of times to obtain a desired film thickness and desired film/material properties. In accordance with particular examples, a cycle of at least one depositing material step and at least one treating the deposited material step is repeated a number of times.

Treatment cycle 1204 or a step of treating the deposited material includes providing an oxygen-free gas to the reaction chamber (e.g., a continuation of inert gas pulse 1214) and applying a third plasma power for a third plasma power period 1216 to form activated species from the oxygen-free gas to treat the deposited material to thereby form treated material.

The third plasma power can be between about 10 W and about 100 W or between about 30 W and about 80 W and/or have a frequency between about 13 MHz and about 14 MHz or between about 26 MHz and about 28 MHz. In some cases, the frequency of the third plasma power during pulse period 1216 can be about the same as the frequency of the power during pulse period 1210 (e.g., a HRF frequency). In accordance with examples of the disclosure, a frequency of the third plasma power is greater than the first frequency of the first plasma power.

One or more treatment cycles can be used to further tune desired properties of the deposited/treated material. For example, strength of the deposited material can be further increased and/or stress of the deposited material can be decreased.

Table 2 illustrates exemplary process conditions in accordance with particular examples of the disclosure that include a step of treating. The table is meant to illustrate exemplary conditions and not necessarily limit the scope of the disclosure.

TABLE 2

| | SiO deposition step | Treatment step |
|---|---|---|
| Source vessel temp. [deg C.] | 20 to 100 (Preferably 40 to 70) | 20 to 100 (Preferably 40 to 70) |
| Source carrier Ar [sccm] | 2000 to 6000 (Preferably 3000 to 5000) | 2000 to 6000 (Preferably 3000 to 5000) |
| $O_2$ [sccm] | 2000 to 6000 (Preferably 3000 to 5000) | — |
| Purge Ar [sccm] | 500 to 2000 (Preferably 1000 to 1500) | 2000 to 8000 (Preferably 4000 to 6000) |
| Pressure [Pa] | 100 to 500 (Preferably 200 to 400) | 100 to 500 (Preferably 200 to 400) |
| HRF power [W] | 100 to 400 (Preferably 200 to 300) | 10 to 100 (Preferably 30 to 80) |
| LRF power [W] | 50 to 300 (Preferably 100 to 200) | — |
| Heating block temp. | 20 to 100 (Preferably 40 to 80) | 20 to 100 (Preferably 40 to 80) |

TABLE 2-continued

| | | SiO deposition step | Treatment step |
|---|---|---|---|
| [deg C.] | | | |
| Showerhead temp. [deg C.] | | 50 to 100 (Preferably 60 to 90) | 50 to 100 (Preferably 60 to 90) |
| Reactor wall temp. [deg C.] | | 50 to 100 (Preferably 60 to 90) | 50 to 100 (Preferably 60 to 90) |
| Reaction gap [mm] | | 5 to 10 (Preferably 6 to 8) | 5 to 10 (Preferably 6 to 8) |
| Time | Source-Feed [sec] | 0.05 to 1.0 (Preferably 0.1 to 0.6) | — |
| | Purge [sec] | 0.05 to 1.0 (Preferably 0.1 to 0.6) | 0.05 to 1.0 (Preferably 0.1 to 0.6) |
| | RF-ON [sec] | 0.05 to 1.0 (Preferably 0.1 to 0.6) | 0.05 to 2.0 (Preferably 0.1 to 1.5) |
| | Purge [sec] | 0.05 to 1.0 (Preferably 0.1 to 0.6) | 0.05 to 1.0 (Preferably 0.1 to 0.6) |
| SI source | | Silane based Si precursor | |

Figure 11:
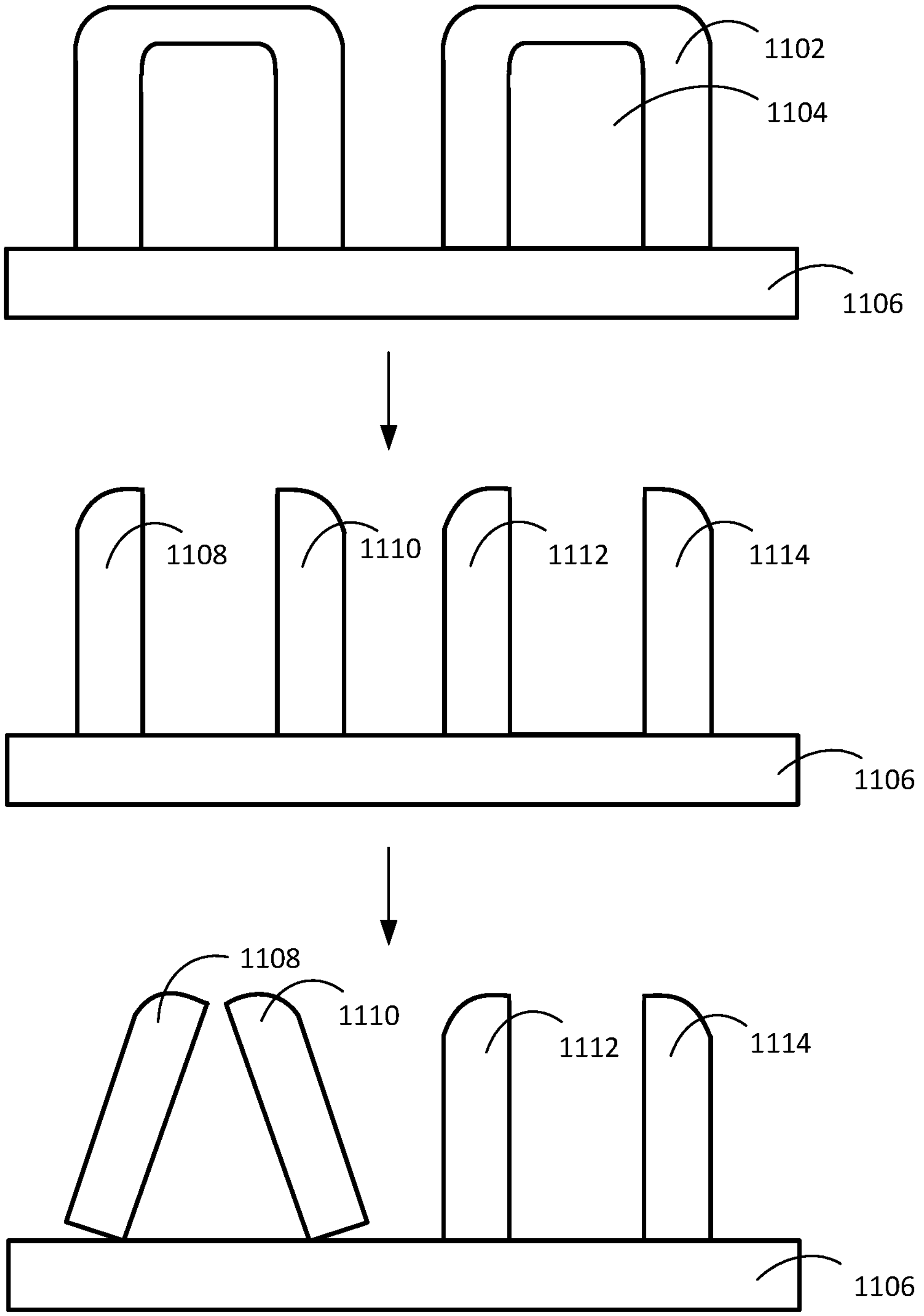
FIG. 11 illustrates a film deposited on patterned features.

FIG. 11 illustrates a film 1102 deposited with undesirably high stress formed overlying features 1104 on a substrate 1106. As film 1102 is etched to form patterned structures 1108-1114, patterned structure 1108-1114 can begin to lean, which can deleteriously affect desired pattern transfer.

Using a method as described herein can reduce such unwanted leaning of patterned structures, while maintaining a desired pattern by mitigating damage to features 1104 during the deposition of film 1102.

Use of an oxygen-free gas plasma treatment can cause loss of feature 1104 material. However, using a treatment step as described herein, an elastic modulus of the treated material can be increased, while reducing material loss of feature 1104 material that might otherwise occur.

In accordance with examples of the disclosure, a ratio of depositing the material steps to the treating the deposited material steps can be selected to tune the desired strength (e.g., elastic modulus) and stress of the treated material. For example, a number of depositing material steps to a number of treating the deposited material steps can be between about 1:1 and about 30:1 or between about 3:1 and about 10:1 or about 7:1 and about 10:1. In accordance with further examples, the step of treating the deposited material (e.g., cycle 1204) is repeated one or more times prior to proceeding to a subsequent step.

Figure 5:
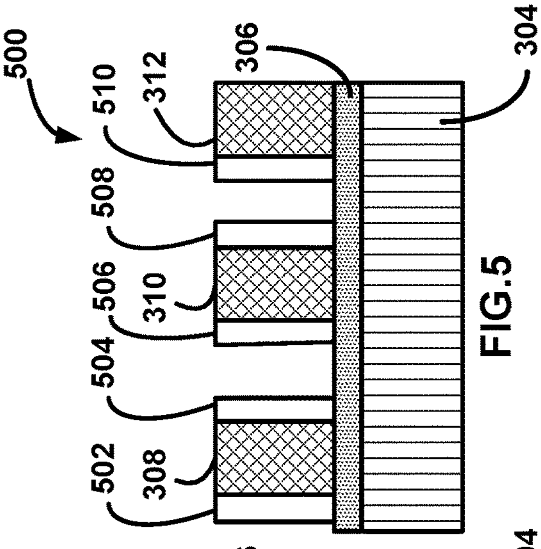

Returning to FIG. 1, once step 104 (e.g., timing sequence 200) is complete, a portion of the layer 402 can be removed to form device structure 500, including patterned structures 502-508, also referred to as spacers, as illustrated in FIG. 5. A portion of layer 402 can be removed using, for example, a dry etch process (e.g., using activated fluorine). A reactant during the dry etch process can include, for example, $NF_3$ at about 50 to about 300° C.

Figure 6:
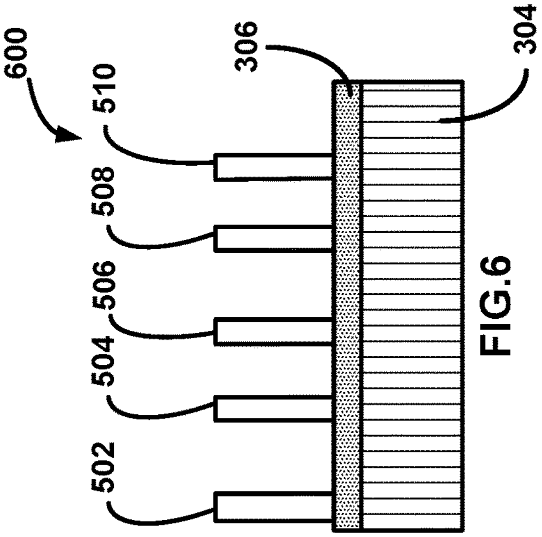

During step 108, patterned features 308-312 or any remaining portions thereof can be removed. For example, an aching process can be used to remove patterned features 308-312 to form device structure 600, as illustrated in FIG. 6.

Figure 7:
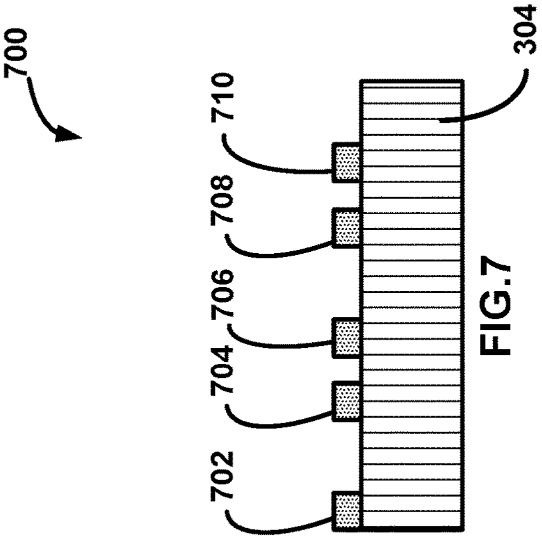

During step 110, layer 306 can be etched using patterned structures 502-508 as a templated mask to form device structure 700, as illustrated in FIG. 7. Device structure 700 includes substrate 304 and patterned structures 702-708 formed thereon. Any suitable etch process can be used to form features 702-708 and will generally depend on the composition of layer 306.

Figure 8:
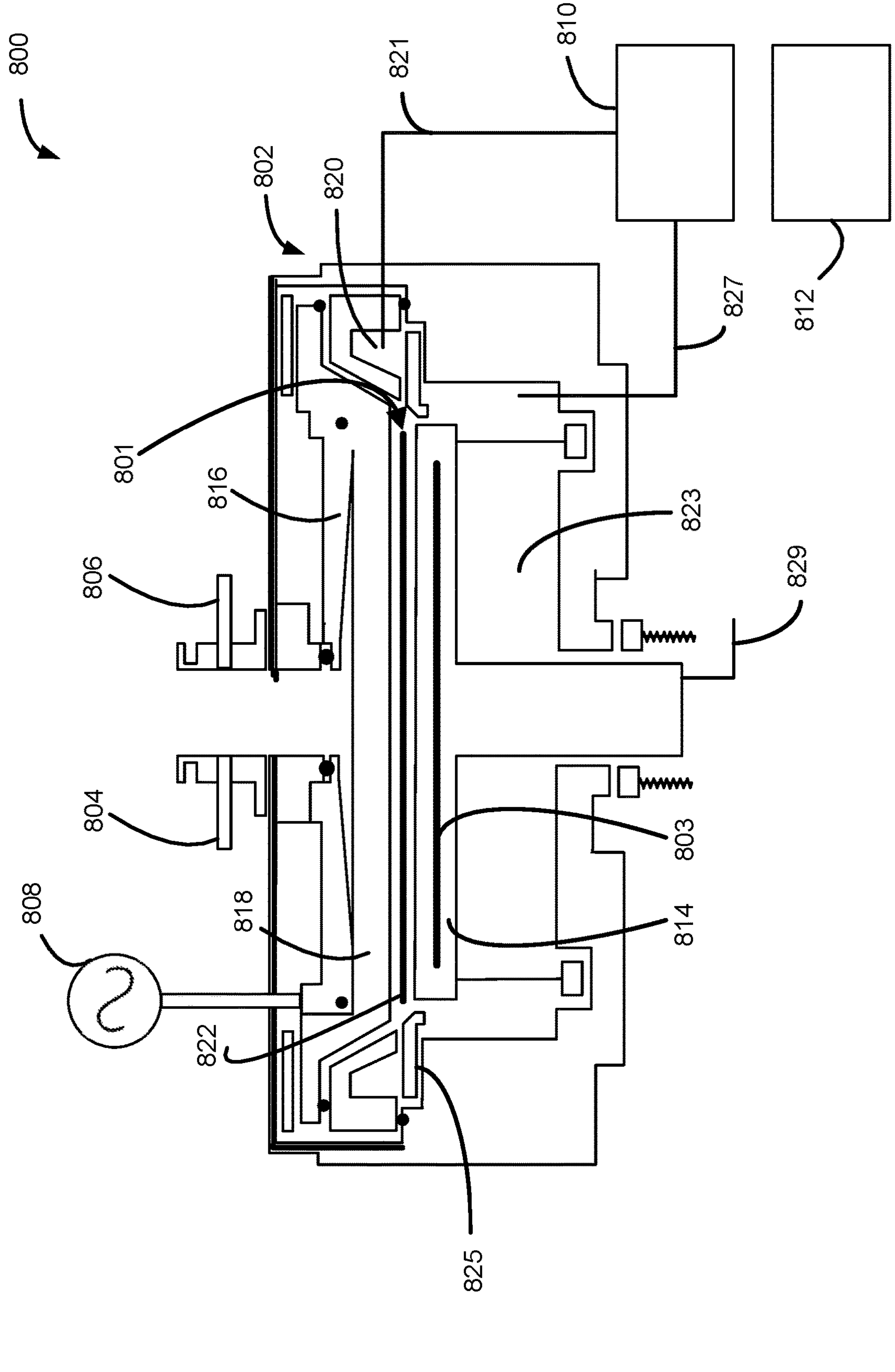
FIG. 8 illustrates a system in accordance with at least one embodiment of the disclosure.

Turning now to FIG. 8, a reactor system 800 in accordance with exemplary embodiments of the disclosure is illustrated. Reactor system 800 can be used to perform one or more steps or substeps as described herein and/or to form one or more device structures or portions thereof as described herein.

Reactor system 800 includes a pair of electrically conductive flat-plate electrodes 814, 818 in parallel and facing each other in an interior 801 (reaction zone) of a reaction chamber 802. Although illustrated with one reaction chamber 802, system 800 can include two or more reaction chambers. A plasma can be excited within reaction chamber 802 by applying, for example, LRF or LRF+HRF power from plasma power source(s) 808 to one electrode (e.g., electrode 818) and electrically grounding the other electrode (e.g., electrode 814). A temperature regulator 803 can be provided in a lower stage 814 (the lower electrode), and a temperature of a substrate 822 placed thereon can be kept at a desired temperature, such as the temperatures noted above. Electrode 818 can serve as a gas distribution device, such as a shower plate or showerhead. Precursor gases, reactant gases, and a carrier or inert gas, if any, or the like can be introduced into reaction chamber 802 using one or more gas lines (e.g., reactant gas line 804 and precursor gas line 806, respectively, coupled to a reactant source and a precursor source). For example, an inert gas and a reactant (e.g., as described above) can be introduced into reaction chamber 802 using line 804 and/or a precursor and a carrier gas (e.g., as described above) can be introduced into the reaction chamber using line 806. Although illustrated with two inlet gas lines 804, 806, reactor system 800 can include any suitable number of gas lines.

In reaction chamber 802, a circular duct 820 with an exhaust line 821 can be provided, through which gas in the interior 801 of the reaction chamber 802 can be exhausted to an exhaust source 810. Additionally, a transfer chamber 823 can be provided with a seal gas line 829 to introduce seal gas into the interior 801 of reaction chamber 802 via the interior (transfer zone) of transfer chamber 823, wherein a separation plate 825 for separating the reaction zone 801 and the transfer chamber 823 can be provided (a gate valve through which a substrate is transferred into or from transfer chamber 823 is omitted from this figure). Transfer chamber 823 can also be provided with an exhaust line 827 coupled to exhaust source 810. In some embodiments, continuous flow of a carrier gas to reaction chamber 802 can be accomplished using a flow-pass system (FPS).

Reactor system 800 can include one or more controller(s) 812 programmed or otherwise configured to cause one or more method steps as described herein to be conducted. Controller(s) 812 are coupled with the various power sources, heating systems, pumps, robotics and gas flow controllers, or valves of the reactor, as will be appreciated by the skilled artisan. By way of example, controller 812 can be configured to control gas flow of a precursor, a reactant, and an inert gas into at least one of the one or more reaction chambers to form a layer on a surface of a substrate. Controller 812 can be further configured to provide power (e.g., LRF or LRF+HRF) to form a plasma—e.g., within reaction chamber 802. Controller 812 can be similarly configured to perform additional steps as described herein. By way of examples, controller 812 can be configured to control gas flow of a precursor and a reactant into at least one of the one or more reaction chambers to form a layer overlying a substrate and to provide the first plasma power and optionally the second plasma power within the at least one reaction chamber, wherein a first frequency of the first plasma power is different than a second frequency of the second plasma power. Controller 812 can be further configured to perform a step of treating the deposited material as described above.

Controller 812 can include electronic circuitry and software to selectively operate valves, manifolds, heaters, pumps and other components included in system 800. Such circuitry and components operate to introduce precursors, reactants, and purge gases from the respective sources. Controller 812 can control timing of gas pulse sequences, temperature of the substrate and/or reaction chamber, pressure within the reaction chamber, and various other operations to provide proper operation of the system 800.

Controller 812 can include control software to electrically or pneumatically control valves to control flow of precursors, reactants, and/or purge gases into and out of the reaction chamber 802. Controller 812 can include modules, such as a software or hardware component, e.g., a FPGA or ASIC, which performs certain tasks. A module can advantageously be configured to reside on the addressable storage medium of the control system and be configured to execute one or more processes.

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

During operation of system 800, substrates, such as semiconductor wafers, are transferred from, e.g., a substrate handling area 823 to the reaction zone 801. Once substrate (s) are transferred to reaction zone 801, one or more gases, such as precursors, reactants, carrier gases, and/or purge gases, are introduced into reaction chamber 802.

Figure 9:
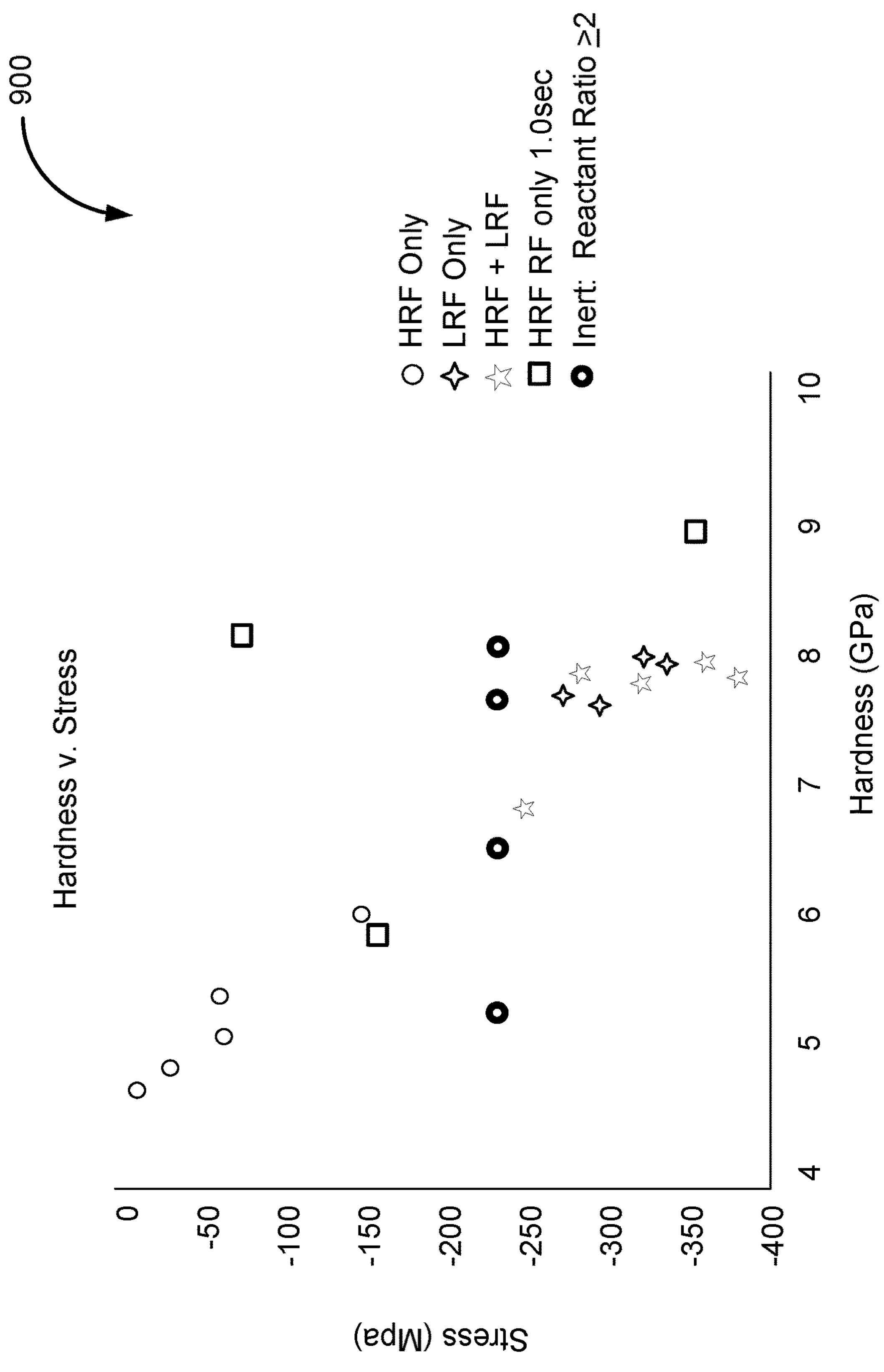
FIG. 9 illustrates hardness and stress values of layers formed in accordance with examples of the disclosure.

FIG. 9 illustrates stress (MPa) and hardness (GPa) data for layers formed with high frequency (HRF) power only, low frequency (LRF) power only, HRF and LRF power, HRF power for only 1 second, and optionally HRF and LRF with higher inert gas:reactant gas ratios (greater than 2). Hardness generally increases with increasing the LRF power (e.g., from about 0 to 100 W to about 200 W). It was also shown that stress and a dry etch rate generally decreases as LRF power is increased (e.g., from about 0 to 100 W to about 200 W). Indeed, stress became compressive with increasing LRF. Film stress is often associated with leaning of patterned structures, so it is desirable to keep the film stress low. It was also shown that elastic modulus was improved (increased) by adding LRF power during the deposition of the layer.

The HRF and the LRF power and low frequency (LRF) power may determine mechanical properties of the film (e.g. desired hardness and stress). Further, inert gas:reactant gas ratios greater than 2 with these power settings produce films with desired properties, including desired (relatively low) etch rates and/or high etch rate ratios. Properties (e.g., mechanical properties, such as those described herein) of the layer and/or the patterned features can be manipulated by manipulating one or more of an inert gas:reactant flow ratio to the reaction chamber, manipulating an intensity of the first plasma power (e.g., LRF), and/or manipulating a duration of the first plasma power during a deposition cycle 1202 and/or treatment 1204 and/or by manipulating a ratio of deposition cycles to treatment cycles as described above. For example, an inert gas:reactant flow ratio and/or LRF power during a deposition cycle can be increased to lower stress and/or lower an etch rate and/or increase hardness of the layer/structures. Thus, exemplary methods, such as method 100, can also include manipulating properties of the patterned structures by, for example, manipulating one or more of an inert gas:reactant flow ratio and/or manipulating a power of the first plasma power.

Figure 13:
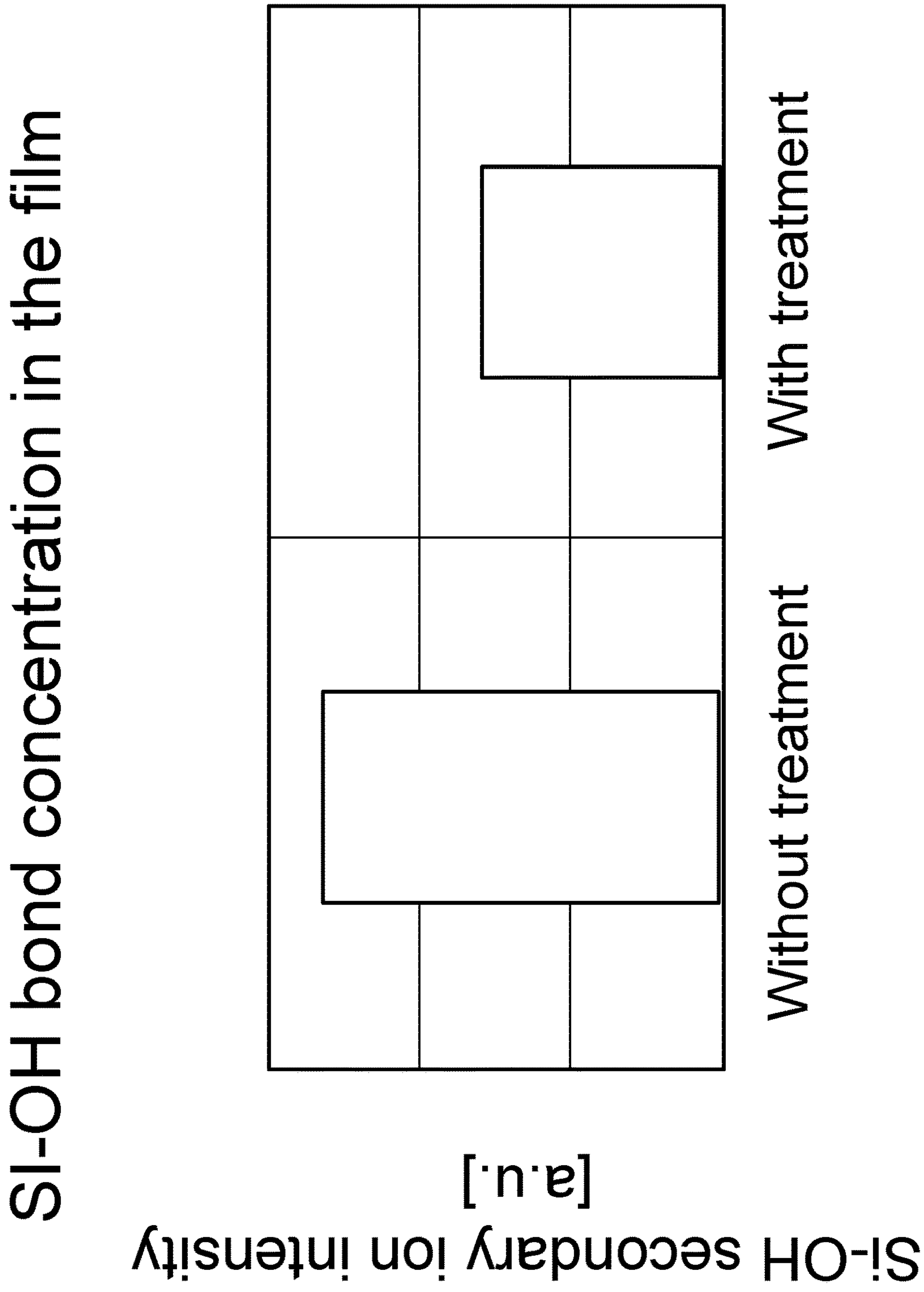
Figure 14:
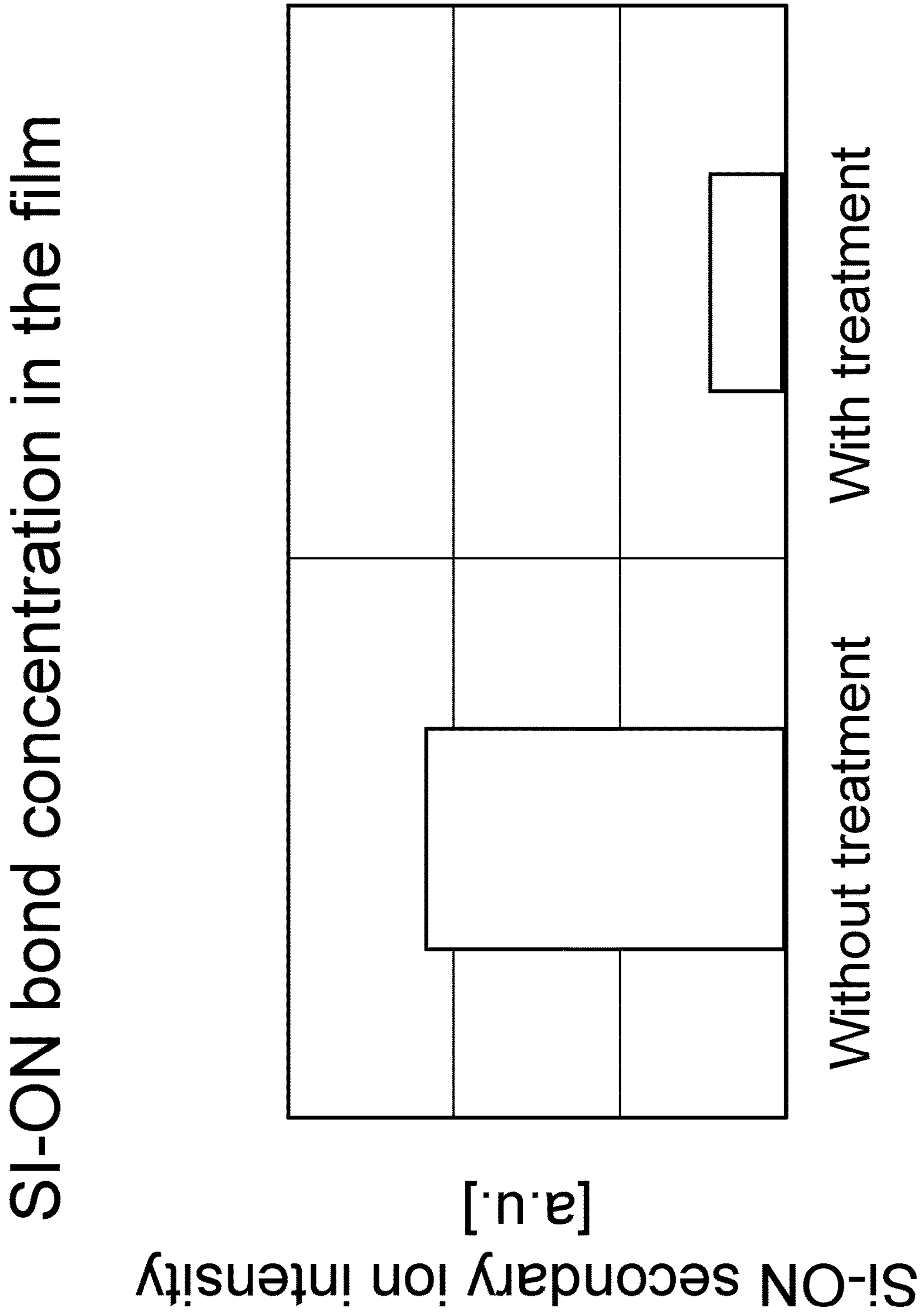
Figure 15:
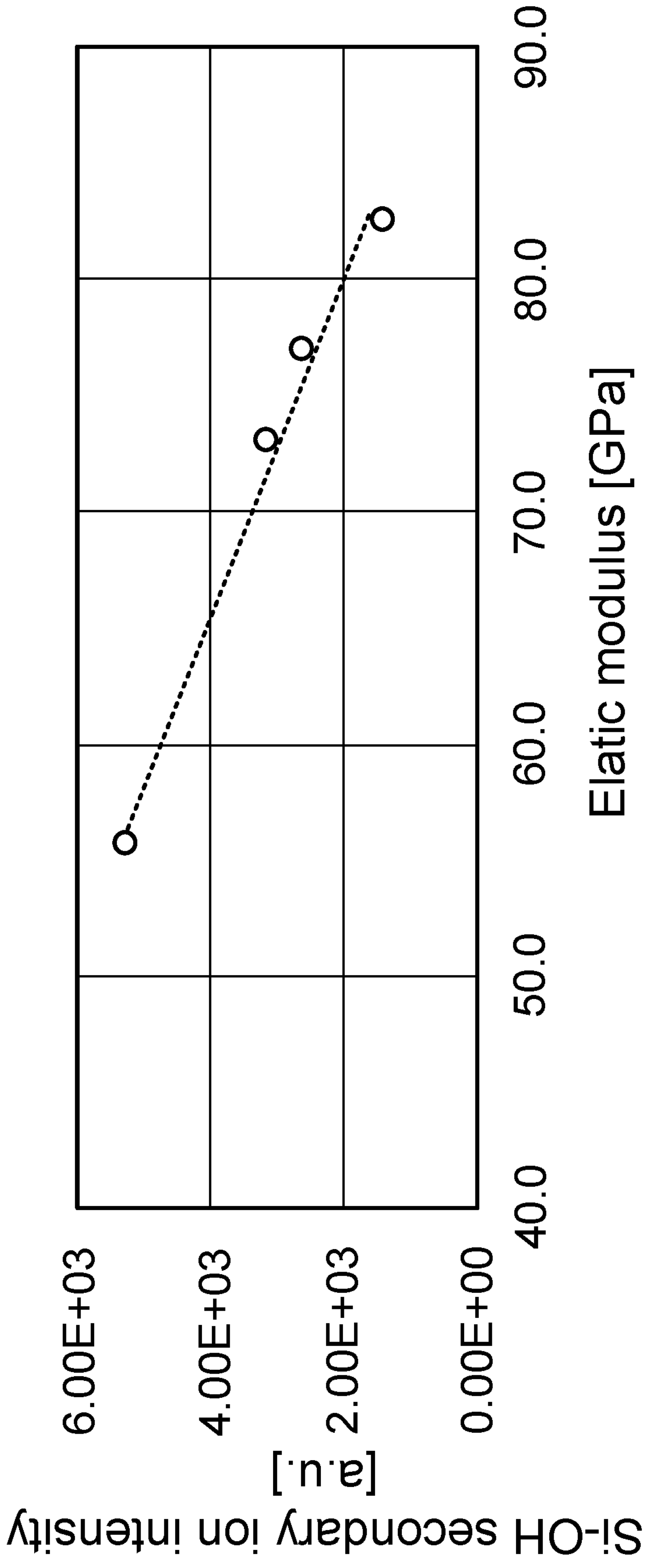

FIG. 13 illustrates that an Si—OH bond concentration of silicon oxide is reduced by treating deposited material as described herein. FIG. 14 illustrates that an Si—ON bond concentration can also be reduced by treating material as described herein. FIG. 15 illustrates that an elastic modulus of treated material increases as the Si—OH bond concentration decreases.

Figure 16:
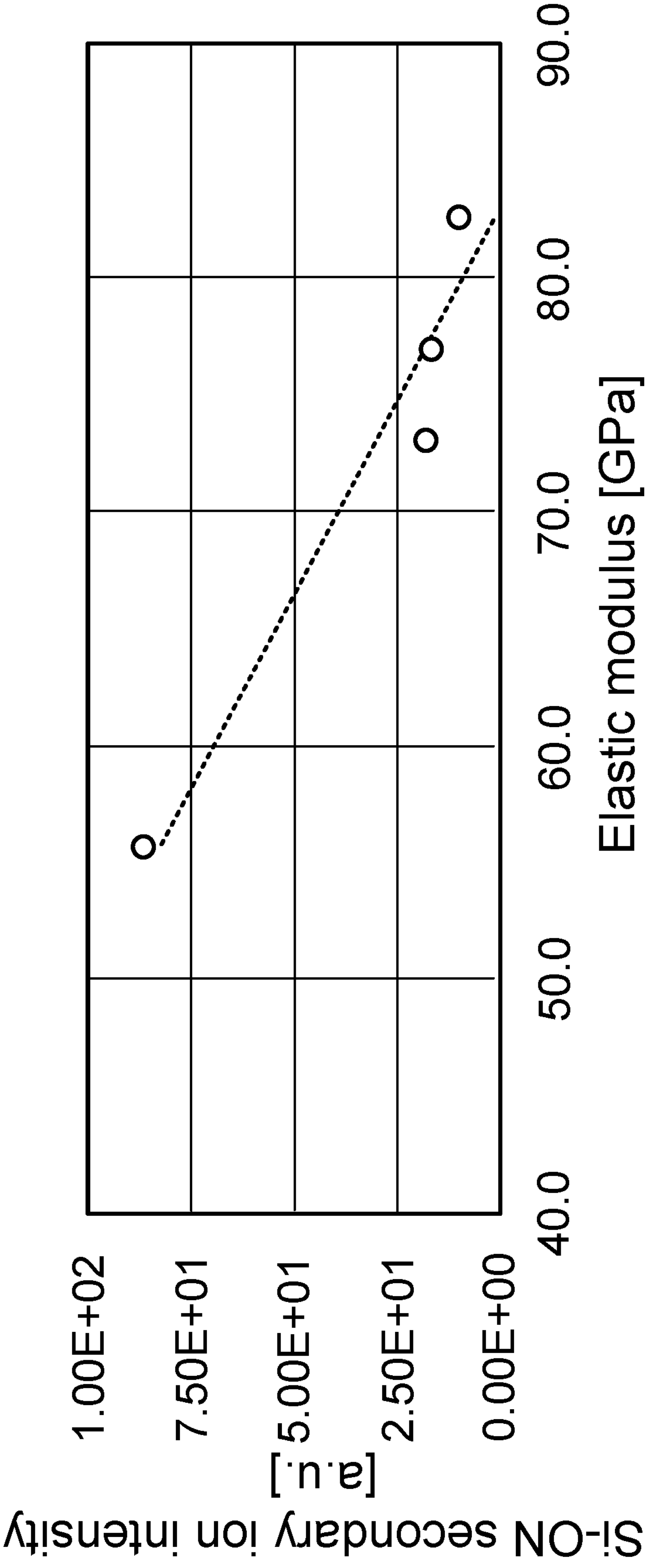

FIG. 16 similarly illustrates that the elastic modulus of treated material increases as the Si—ON bond concentration decreases. Thus, in accordance with examples of the disclosure, a strength of the treated material is greater than a strength of the deposited material. In accordance with further examples, an elastic modulus of the treated material is greater than 60 GPa.

As a concentration of Si—ON bonds and/or a concentration of Si—OH bonds decreases (e.g., a concentration of impurities such as N and O decreases), a concentration of Si—Si bonds in a silicon oxide deposited material generally increases. Therefore, in accordance with examples of the disclosure, an amount of Si—Si bonds in the treated material is greater than an amount of Si—Si bonds in the deposited material.

Figure 17:
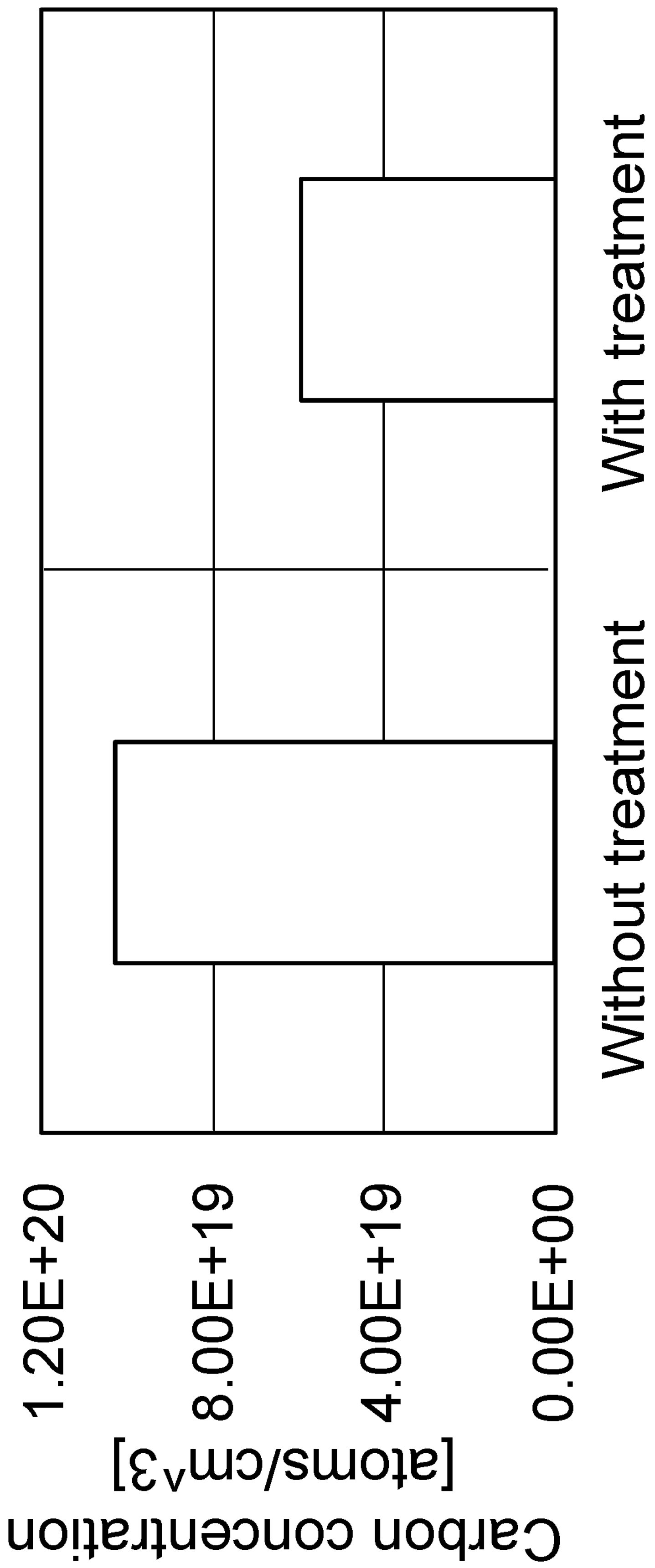

FIG. 17 illustrates that the carbon concentration of silicon oxide formed according to a method described herein is reduced by treating deposited material as described herein. Thus, in accordance with examples of the disclosure, an amount of carbon impurity in the treated material is less than an amount of carbon in the deposited material.

Figure 18:
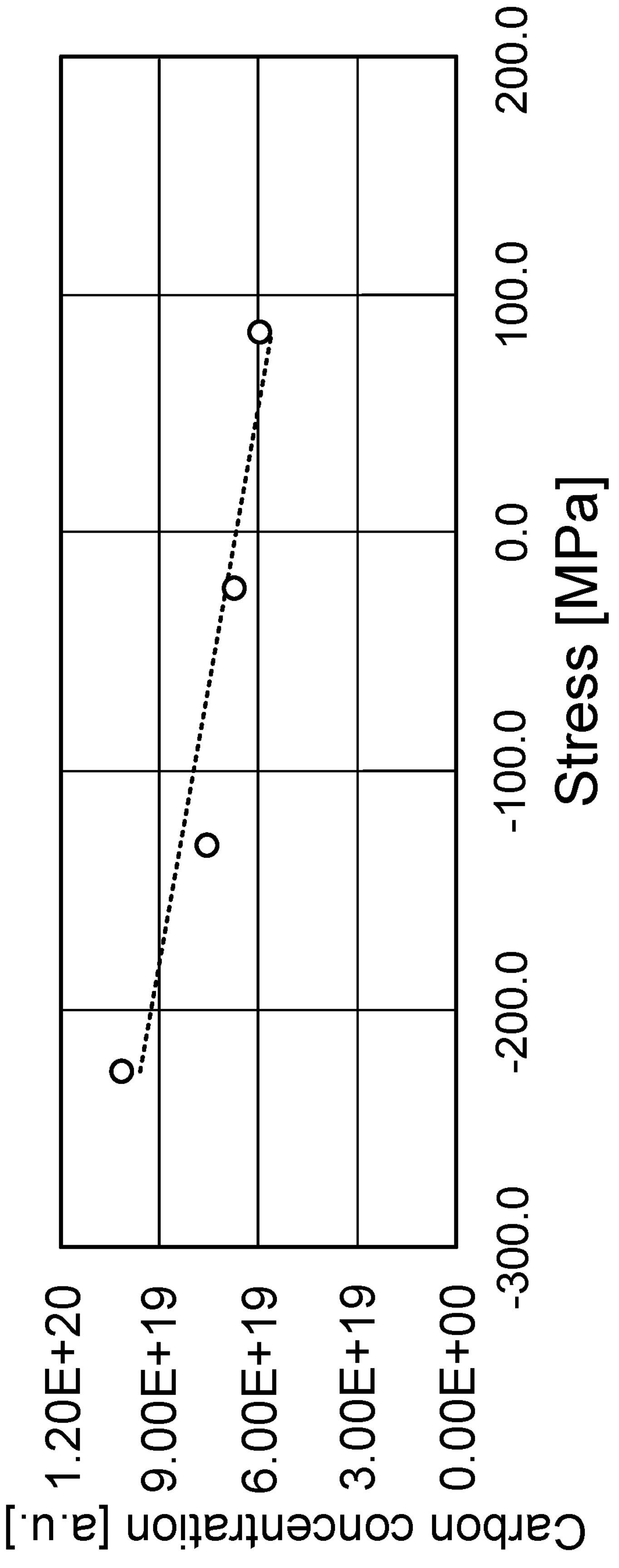

FIG. 18 illustrates that as a concentration of carbon is reduced, a stress in the treated material is also reduced. Thus, in accordance with examples of the disclosure, a stress of the treated material is less than a stress of the deposited material. By way of examples, a stress of the treated material is −150 MPa or less stress (e.g., from 0 or neutral stress to −150 MPA)—e.g., when HRF is provided during the step of treating.

As shown in FIG. 13 to FIG. 18, treating the material may reduce the amount of impurities in the treated film, leading to an increase of mechanical property (e.g. increase of elastic modulus) and a decrease of stress (e.g. relaxed film stress). Therefore, a leaning of the film may be minimized.

FIG. 19 illustrates that damage to pattered features 1902 and 1904 is relatively low when forming layer 1906, 1908—with or without a step of treating as described above.

FIGS. 23 and 24 illustrate elastic module values and pattern feature dimension loss as a function of CK (a ratio of deposition cycles to treatment cycles).

Figure 4:
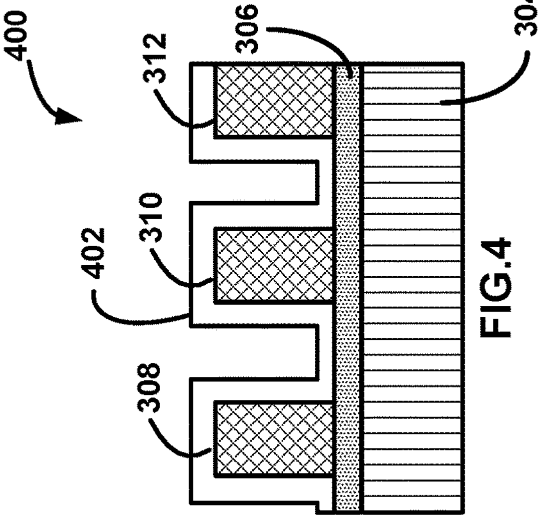

In the illustrated examples, the plasma treatment time was 0.8 seconds in FIG. 23 and 4.0 seconds in FIG. 24. As illustrated, a difference of a loss of material of the patterned features between the long plasma treatment time in FIG. 24 and the short plasma treatment time in FIG. 23 is reduced. In other words, as the CK value increases, a damage to the sublayer may be reduced. The other conditions can be as set forth in Table 2. As shown, material loss of the patterned features can be reduced by increasing CK.

Figure 20A:
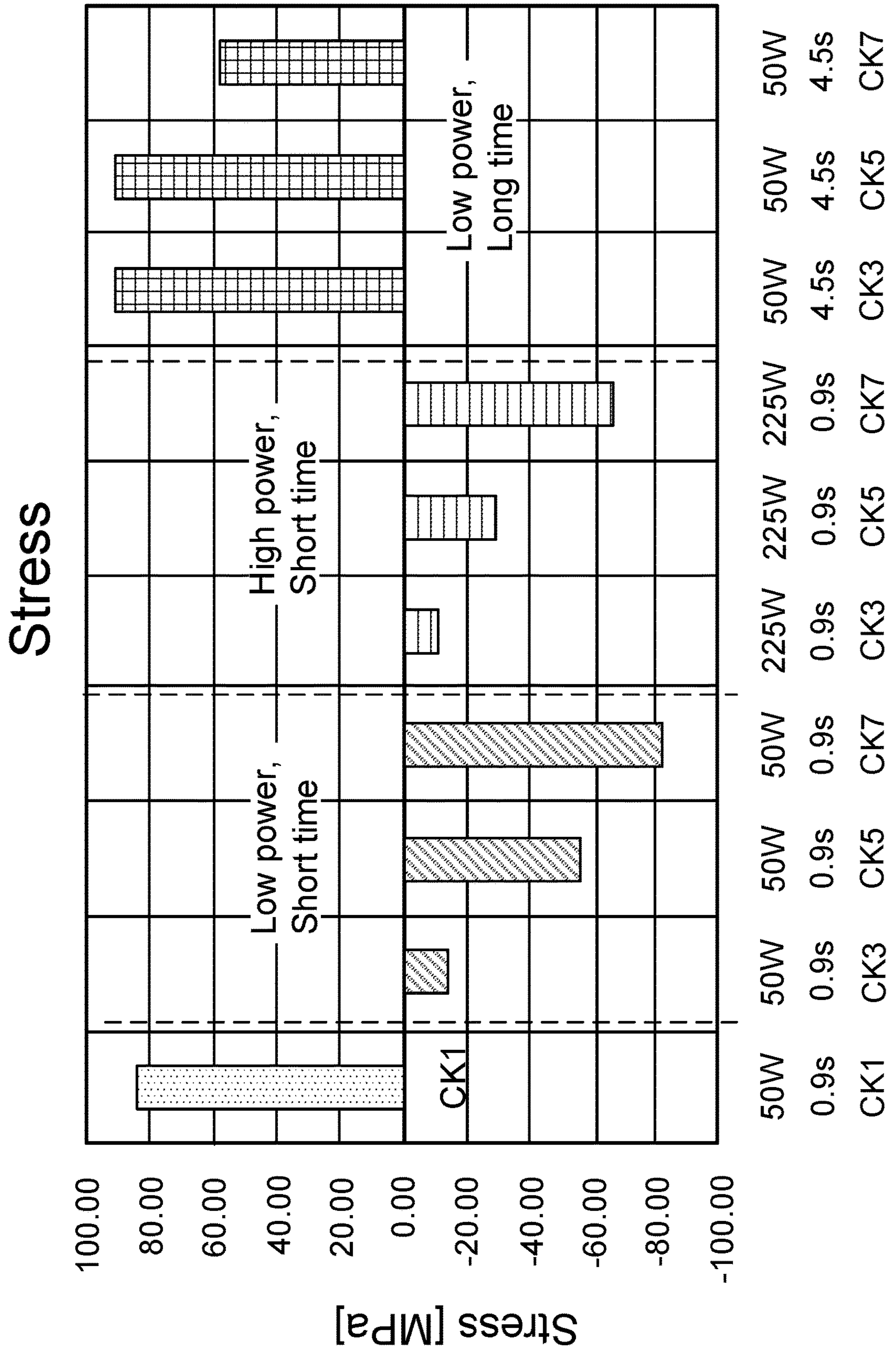
Figure 20B:
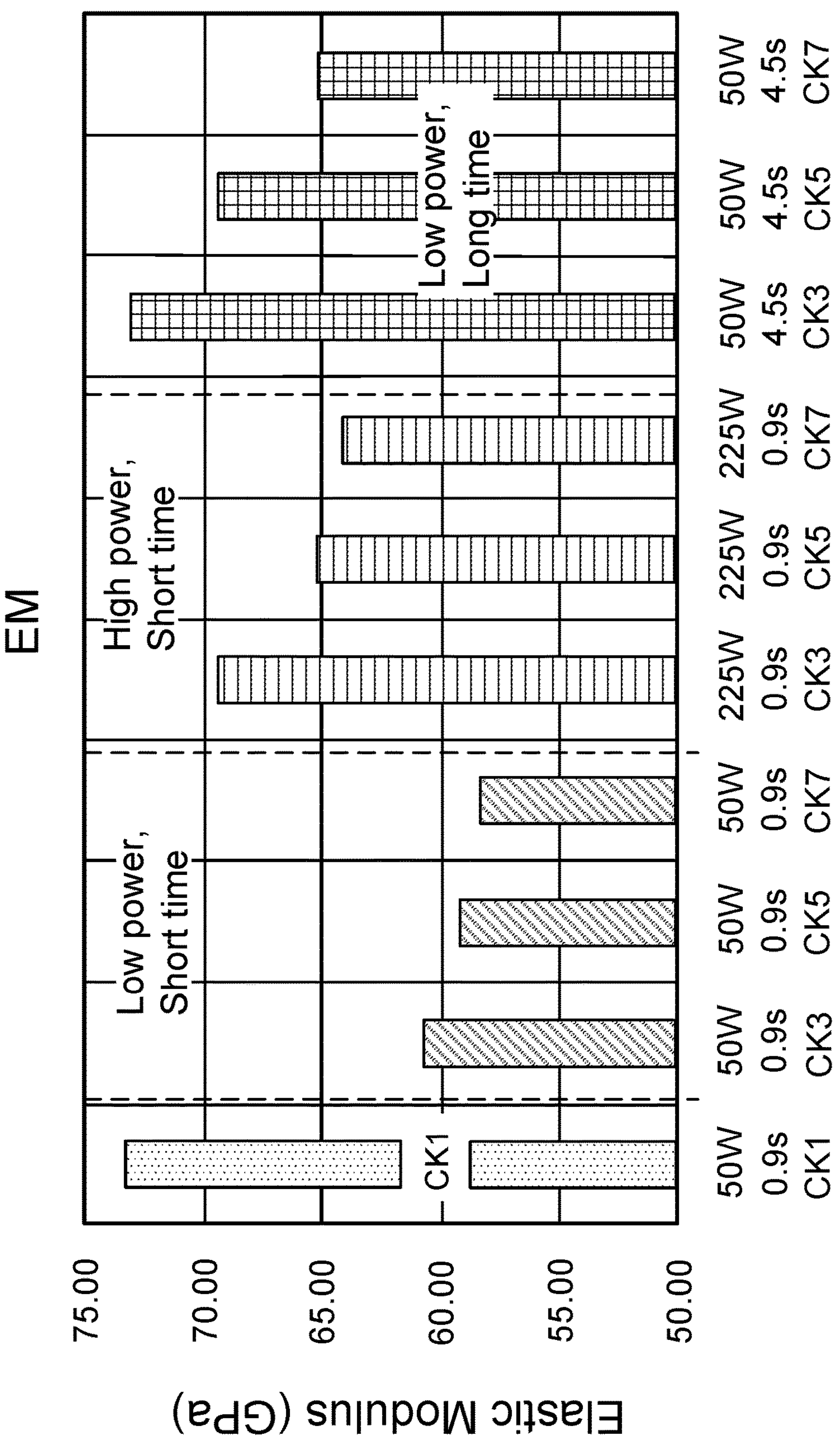

FIGS. 20A and 20B illustrate a film stress and an elastic modulus according to the treating condition. FIG. 20A and FIG. 20B illustrate that CK value, plasma power and plasma treatment time may be used to manipulate a stress and/or strength (elastic modulus) in a treated material.

As shown in FIGS. 20A and 20B, when the CK value is greater than 3, a plasma power is lower and the plasma treatment time is long, the film stress may be turned into tensile from compressive and the strength (elastic modulus) may increase. For instance, when the CK value is greater than 3, the high frequency plasma power is 50 W and the plasma treatment time is 4.5 seconds, a desired film stress may be obtained, i.e. the film stress becomes tensile (i.e. relaxed film stress) and the film strength increases.

Figure 21:
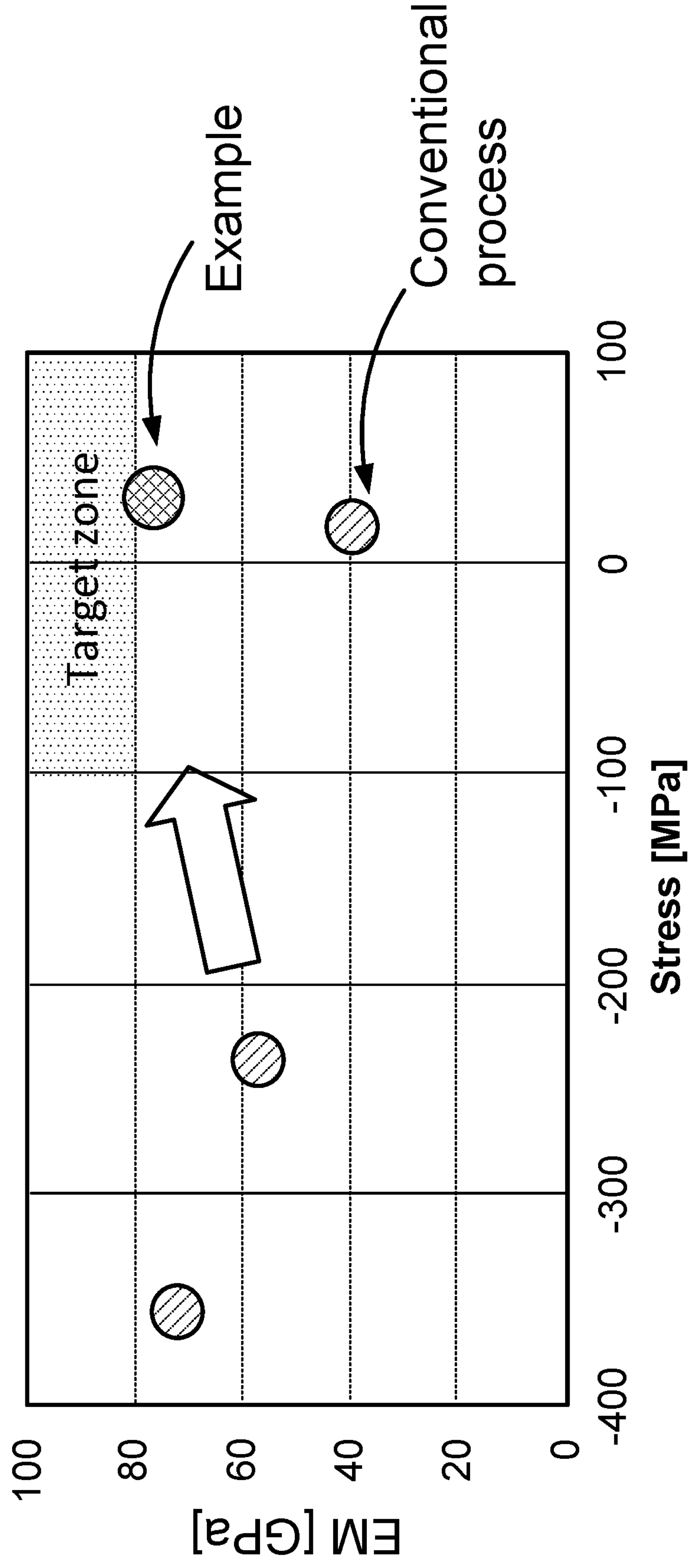

FIG. 21 illustrates that both stress and elastic modulus (Example) of a film processed with a treating condition according to the disclosure may be improved over conventional processes. For instance, a film with a stress and a strength when the plasma power is low and the treatment time is long in FIG. 20A and FIG. 20B may have film properties within the targeted film property zone in FIG. 21.

Figure 22:
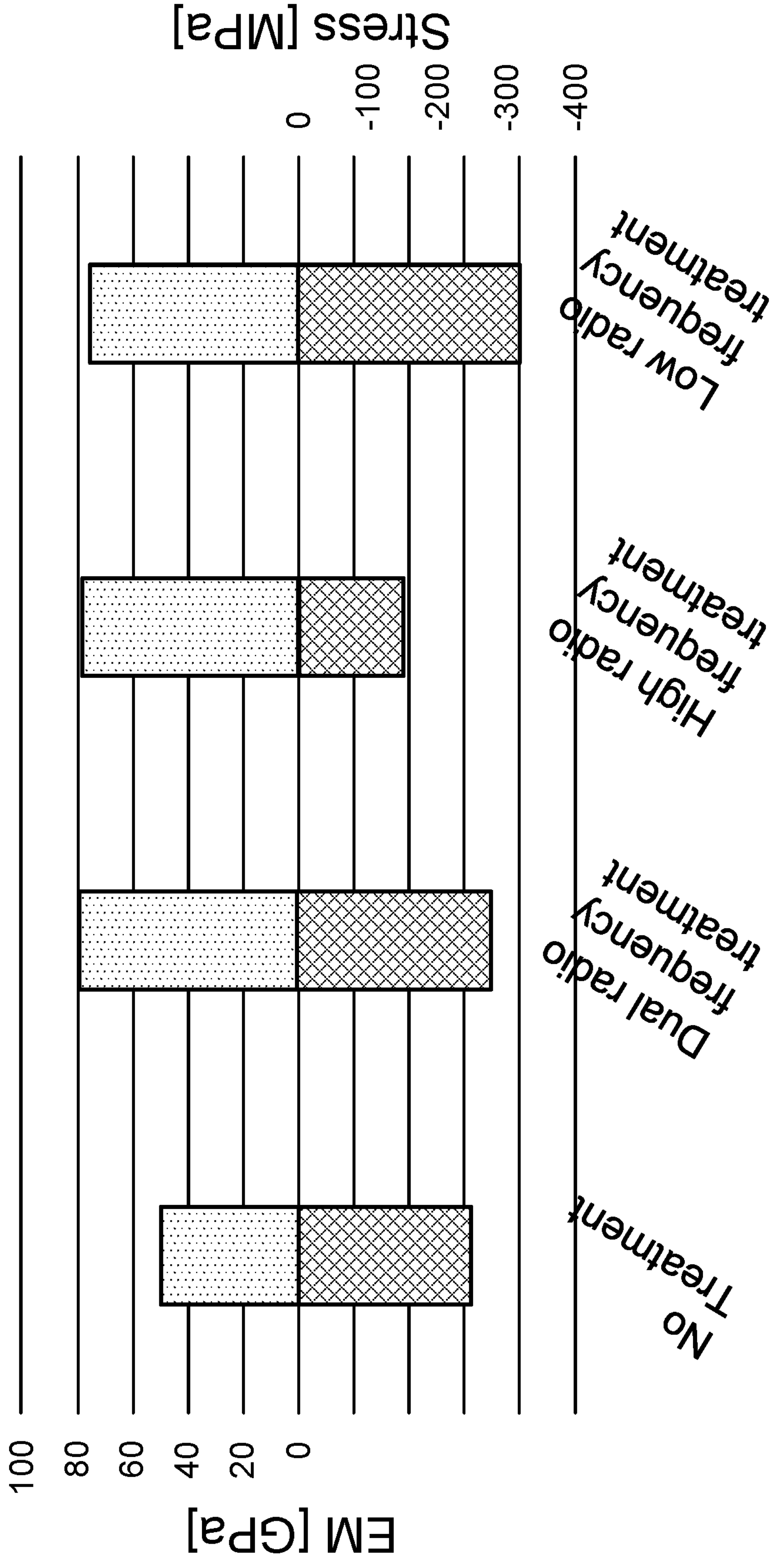

FIG. 22 illustrates the effect of various frequencies of power used during a step of treating. As illustrated in FIG. 22, when the treatment is carried out, the film strength (Elastic Modulus) improves. Especially when the treatment is carried out with high frequency power, the film stress is much reduced compared to other conditions (FIG. 12 shows a high frequency RF power is applied in the treatment step). Exemplary conditions are provided above in Table 2.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

What is claimed is:

1. A method of forming patterned structures using a multiple patterning process, the method comprising the steps of:

- providing a substrate within a reaction chamber, the substrate comprising a surface comprising patterned features; and
- forming a layer overlying the substrate, wherein the step of forming the layer comprises:
  - depositing a material, wherein the step of depositing the material comprises:
    - providing a precursor to the reaction chamber for a precursor pulse period;
    - providing a reactant to the reaction chamber for a reactant pulse period; and
    - applying a first plasma power, having a first frequency less than 1 MHz for a first plasma power period, and a second plasma power, having a second frequency, for a second plasma power period, wherein the first frequency is different than the second frequency, and wherein the first plasma power period and the second plasma power period overlap; and
  - treating the deposited material, wherein the step of treating the deposited material comprises:
    - providing an oxygen-free gas to the reaction chamber; and
    - applying a third plasma power for a third plasma power period to form activated species from the oxygen-free gas to treat the deposited material to thereby form treated material.

2. The method of claim 1, wherein the reactant comprises oxygen.

3. The method of claim 1, wherein the step of treating the deposited material is repeated one or more times prior to proceeding to a subsequent step.

4. The method of claim 3, wherein a ratio of a number of depositing material steps to a number of treating the deposited material steps is between about 3:1 and about 10:1.

5. The method of claim 4, wherein a cycle of at least one depositing material step and at least one treating the deposited material step is repeated a number of times.

6. The method of any of claim 1, wherein the oxygen-free gas comprises one or more of argon, helium and/or nitrogen.

7. The method of any of claim 1, wherein the patterned features comprise amorphous carbon.

8. The method of any of claim 1, wherein an amount of Si—Si bonds in the treated material is greater than an amount of Si—Si bonds in the deposited material.

9. The method of any of claim 1, wherein an amount of carbon in the treated material is less than an amount of carbon in the deposited material.

10. The method of any of claim 1, wherein a stress of the treated material is less than a stress of the deposited material.

11. The method of any of claim 1, wherein a strength of the treated material is greater than a strength of the deposited material.

12. The method of claim 1, wherein a frequency of the third plasma power is greater than the first frequency.

13. The method of claim 1, wherein the first plasma power is between about 100 W and about 200 W, the second plasma power is between about 200 W and about 300 W, and the third plasma power is between about 30 W and about 80 W.

14. The method of claim 12, wherein a frequency of the third plasma power is between about 13 MHz and about 14 MHz or between about 26 MHz and about 28 MHz.

15. The method of claim 1, wherein, during providing the reactant, a ratio of inert gas to the reactant is greater than or equal to 2.

16. The method of claim 15, wherein the reactant and the inert gas are continuously provided during the depositing the material.

17. The method of claim 1, wherein a pressure within the reaction chamber during the step of depositing material is between about 100 Pa and about 500 Pa or between about 200 Pa and about 400 Pa.

18. The method of claim 1, wherein a temperature of the substrate during the step of depositing material is between about 20° C. and about 100° C. or between about 40° C. and about 80° C.

19. The method claim 1, wherein the first frequency is between about 300 kHz and about 500 KHz.

20. The method of claim 1, wherein the second frequency is between about 13 MHz and about 14 MHz or between about 26 MHz and about 28 MHz.

21. The method of claim 1, wherein an elastic modulus of the treated material is greater than 60 GPa.

22. The method according to claim 1, wherein a stress of the treated material is −150 MPa to about 0 Pa.

* * * * *